United States Patent
O Dwyer et al.

(10) Patent No.: US 11,347,155 B2
(45) Date of Patent: May 31, 2022

(54) ILLUMINATION SOURCE FOR AN INSPECTION APPARATUS, INSPECTION APPARATUS AND INSPECTION METHOD

(71) Applicant: ASML Netherlands B.V., Veldhoven (NL)

(72) Inventors: David O Dwyer, Eindhoven (NL); Petrus Wilhelmus Smorenburg, Veldhoven (NL); Gerrit Jacobus Hendrik Brussaard, Boxtel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/055,410

(22) PCT Filed: Apr. 23, 2019

(86) PCT No.: PCT/EP2019/060310
§ 371 (c)(1),
(2) Date: Nov. 13, 2020

(87) PCT Pub. No.: WO2019/219336
PCT Pub. Date: Nov. 21, 2019

(65) Prior Publication Data
US 2021/0191274 A1    Jun. 24, 2021

(30) Foreign Application Priority Data

May 14, 2018    (EP) ...................... 18172113

(51) Int. Cl.
*G03F 9/00*    (2006.01)
*G03F 7/20*    (2006.01)
(Continued)

(52) U.S. Cl.
CPC ............ *G03F 9/7065* (2013.01); *G01B 11/02* (2013.01); *G01N 21/4788* (2013.01);
(Continued)

(58) Field of Classification Search
CPC ............... G03F 9/7065; G03F 7/70033; G03F 7/70616; G03F 7/70025; G03F 7/70158;
(Continued)

(56) References Cited

U.S. PATENT DOCUMENTS

| 6,952,253 | B2 | 10/2005 | Lof et al. |
| 7,701,577 | B2 | 4/2010 | Straaijer et al. |

(Continued)

FOREIGN PATENT DOCUMENTS

| DE | 4219810 A1 | 12/1993 |
| DE | 10238078 C1 | 12/2003 |

(Continued)

OTHER PUBLICATIONS

International Search Report and Written Opinion of the International Searching Authority directed to related International Patent Application No. PCT/EP2019/060310, dated Jul. 11, 2019; 14 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

An illumination source apparatus (500), suitable for use in a metrology apparatus for the characterization of a structure on a substrate, the illumination source apparatus comprising: a high harmonic generation, HHG, medium (502); a pump radiation source (506) operable to emit a beam of pump radiation (508); and adjustable transformation optics (510) configured to adjustably transform the transverse spatial profile of the beam of pump radiation to produce a transformed beam (518) such that relative to the centre axis of the transformed beam, a central region of the transformed beam has substantially zero intensity and an outer region which is radially outwards from the centre axis of the transformed (Continued)

beam has a non-zero intensity, wherein the transformed beam is arranged to excite the HHG medium so as to generate high harmonic radiation (540), wherein the location of said outer region is dependent on an adjustment setting of the adjustable transformation optics.

16 Claims, 16 Drawing Sheets

(51) Int. Cl.

| | | |
|---|---|---|
| *G01N 21/47* | (2006.01) | |
| *G02F 1/35* | (2006.01) | |
| *G02F 1/01* | (2006.01) | |
| *G01B 11/02* | (2006.01) | |
| *G01N 21/88* | (2006.01) | |
| *G02B 5/00* | (2006.01) | |
| *H01S 3/00* | (2006.01) | |
| *H05G 2/00* | (2006.01) | |

(52) U.S. Cl.
CPC ......... *G01N 21/8806* (2013.01); *G02B 5/001* (2013.01); *G02F 1/0102* (2013.01); *G02F 1/353* (2013.01); *G02F 1/3503* (2021.01); *G03F 7/7015* (2013.01); *G03F 7/70025* (2013.01); *G03F 7/70033* (2013.01); *G03F 7/7065* (2013.01); *G03F 7/70158* (2013.01); *G03F 7/70616* (2013.01); *G03F 7/70625* (2013.01); *G03F 7/70633* (2013.01); *G03F 7/70641* (2013.01); *H01S 3/0092* (2013.01); *H05G 2/003* (2013.01); *G02F 1/354* (2021.01)

(58) Field of Classification Search
CPC .. G03F 7/7065; G03F 7/7015; G03F 7/70625; G03F 7/70633; G03F 7/70641; G03F 7/70558; G03F 7/70191; G03F 7/2008; G03F 7/706; G03F 7/705; H01S 3/0092; H01S 3/0959; H01S 3/109; H05G 2/003; G02F 1/3503; G02F 1/353; G02F 1/0102; G02F 1/354; G01B 11/02; G01B 11/272; G01B 9/02091; G01N 21/8806; G01N 21/4788; G01N 21/956; G01N 21/9501; G02B 5/001; G02B 27/095; G02B 27/0955; G02B 27/4255; G01J 1/4257
See application file for complete search history.

(56) References Cited

U.S. PATENT DOCUMENTS

| | | |
|---|---|---|
| 7,791,724 B2 | 9/2010 | Den Boef et al. |
| 8,115,926 B2 | 2/2012 | Straaijer |
| 8,553,227 B2 | 10/2013 | Jordanoska |
| 8,681,312 B2 | 3/2014 | Straaijer |
| 8,692,994 B2 | 4/2014 | Straaijer |
| 8,704,198 B2 | 4/2014 | Kaertner et al. |
| 8,792,096 B2 | 7/2014 | Straaijer |
| 8,797,554 B2 | 8/2014 | Straaijer |
| 8,823,922 B2 | 9/2014 | Den Boef et al. |
| 10,267,744 B2 | 4/2019 | Tinnemans et al. |
| 10,338,484 B2 | 7/2019 | Den Boef et al. |
| 10,642,172 B2 | 5/2020 | Dwyer et al. |
| 2003/0052102 A1* | 3/2003 | Amako ............. B23K 26/0624 219/121.75 |
| 2004/0165269 A1 | 8/2004 | Hasman et al. |
| 2007/0224518 A1 | 9/2007 | Yokhin et al. |
| 2009/0213718 A1 | 8/2009 | Minabe et al. |
| 2010/0288740 A1 | 11/2010 | Komiya et al. |
| 2010/0328655 A1 | 12/2010 | Den Boef |
| 2011/0026032 A1 | 2/2011 | Den Boef et al. |
| 2011/0102753 A1* | 5/2011 | Van De Kerkhof ........................ G01N 21/9501 355/27 |
| 2011/0140009 A1 | 6/2011 | Kaertner et al. |
| 2011/0249244 A1 | 10/2011 | Leewis et al. |
| 2012/0044470 A1 | 2/2012 | Smilde et al. |
| 2013/0155648 A1 | 6/2013 | Morgenbrod et al. |
| 2013/0162996 A1 | 6/2013 | Straaijer et al. |
| 2013/0304424 A1 | 11/2013 | Bakeman et al. |
| 2014/0019097 A1 | 1/2014 | Bakeman et al. |
| 2014/0176930 A1* | 6/2014 | Deguenther ........ G03F 7/70083 355/67 |
| 2016/0161863 A1 | 6/2016 | Den Boef et al. |
| 2016/0282282 A1 | 9/2016 | Quintanilha et al. |
| 2016/0370717 A1 | 12/2016 | Den Boef et al. |
| 2017/0031246 A1 | 2/2017 | Den Boef |
| 2017/0184981 A1 | 6/2017 | Quintanilha et al. |
| 2017/0322497 A1 | 11/2017 | Lin et al. |
| 2018/0073992 A1 | 3/2018 | Van Voorst et al. |
| 2019/0346776 A1 | 11/2019 | Dwyer et al. |

FOREIGN PATENT DOCUMENTS

| | | |
|---|---|---|
| EP | 1 628 164 A2 | 2/2006 |
| EP | 2 700 986 A1 | 2/2014 |
| JP | 2009-205718 A | 9/2009 |
| TW | 201805603 A1 | 2/2018 |
| WO | WO 2011/012624 A1 | 2/2011 |

OTHER PUBLICATIONS

Lemaillet et al., "Intercomparison between optical and x-ray scatterometry measurements of FinFET structures," Metrology, Inspection, and Process Control for Microlithography XXVII, Feb. 24-28, 2013; 8 pages.

Diffractive Axicon Application Notes, Holo/Or Advanced Optical Solutions, retrieved Apr. 9, 2019; 7 pages.

Diffractive Axicon Application Notes, Holo/Or—Laser Components, 2016; 6 pages.

Constant et al., "Spatial shaping of intense femtosecond beams for the generation of high-energy attosecond pulses," Journal of Physics B: Atomic, Molecular and Optical Physics, vol. 45, No. 074018, Mar. 16, 2012; pp. 1-16.

Diffractive Optical Elements (DOE), HoloEye Photonics AG, retrieved Jul. 15, 2019; 4 pages.

Heyl et al., "High-order harmonic generation with μJ laser pulses at high repetition rates," Journal of Physics B: Atomic, Molecular and Optical Physics, vol. 45, No. 074020, Mar. 16, 2012; pp. 1-9.

Altucci et al., "Diffractionless beams and their use for harmonic generation," Optics and Lasers in Engineering, vol. 37, 2002; pp. 565-575.

Mahmoud et al., "Propagation of Bessel beams generated using finite-width Durnin ring," Optical Society of America, Applied Optics, vol. 52, No. 2, Jan. 10, 2013; pp. 256-263.

International Preliminary Report on Patentability directed to related International Patent Application No. PCT/EP2019/060310, dated Nov. 17, 2020; 8 pages.

* cited by examiner

ILLUMINATION SOURCE FOR AN INSPECTION APPARATUS, INSPECTION APPARATUS AND INSPECTION METHOD

CROSS-REFERENCE TO RELATED APPLICATIONS

This application claims priority of EP application 18172113.5 which was filed on 14 May 2018 and which is incorporated herein in its entirety by reference.

TECHNICAL FIELD

The present invention relates to an inspection apparatus and a method for performing a measurement. In particular, it relates to an illumination source apparatus suitable for use in a metrology apparatus for the characterization of a structure on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such a process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

In lithographic processes, it is desirable to frequently make measurements of the structures created, e.g., for process control and verification. Tools to make such measurements are typically called metrology tools MT. Different types of metrology tools MT for making such measurements are known, including scanning electron microscopes or various forms of scatterometer metrology tools MT.

As an alternative to optical metrology methods, it has also been considered to use soft X-rays and/or EUV radiation, for example radiation in a wavelength range between 0.1 nm and 100 nm, or optionally between 1 nm and 50 nm or optionally between 10 nm and 20 nm. A source for generating the soft X-rays and/or EUV radiation may be a source that uses the principle of High Harmonic Generation (HHG).

A problem addressed by the current invention is how to improve the output power of a high harmonic generation, HHG, illumination source used to produce soft x-ray and/or EUV radiation for use in a metrology tool.

SUMMARY OF THE INVENTION

According to a first aspect of the present invention there is provided an illumination source apparatus, suitable for use in a metrology apparatus for the characterization of a structure on a substrate, the illumination source apparatus comprising: a high harmonic generation, HHG, medium; a pump radiation source operable to emit a beam of pump radiation; and adjustable transformation optics configured to adjustably transform the transverse spatial profile of the beam of pump radiation to produce a transformed beam such that relative to the centre axis of the transformed beam, a central region of the transformed beam has substantially zero intensity and an outer region which is radially outwards from the centre axis of the transformed beam has a non-zero intensity, wherein the transformed beam is arranged to excite the HHG medium so as to generate high harmonic radiation, wherein the location of said outer region is dependent on an adjustment setting of the adjustable transformation optics.

The pump radiation source may be operable to emit a beam of pump radiation with a Gaussian transverse spatial profile, and the adjustable transformation optics may be configured to produce a transformed beam with a non-Gaussian or annular transverse spatial profile.

The illumination source apparatus may further comprise a focusing element positioned between the adjustable transformation optics and the HHG medium, the focusing element configured to focus the transformed beam into the HHG medium. The focusing element may be a lens. The focal plane of the focusing element may be positioned substantially in the HHG medium.

The adjustable transformation optics may comprise at least one conical element such as an axicon element.

For example, the adjustable transformation optics may comprise a pair of axicon elements consisting of a first axicon element and a second axicon element, wherein the first axicon element precedes the second axicon element relative to the propagation direction of the beam of pump radiation and wherein an axial separation between the first axicon element and the second axicon element controls said adjustment setting of the adjustable transformation optics.

The pair of axicon elements may consist of one negative axicon element and one positive axicon element. The axicon elements may be reflective axicon elements, refractive axicon elements, or diffractive axicon elements or the pair may be a combination of different types of axicon elements.

The first axicon element of the pair may be a negative reflective axicon which is arranged on the centre axis of the beam of pump radiation and which is configured to reflect the beam of pump radiation towards the second axicon element which may be an annular positive reflective axicon configured to collimate the beam to thereby produce said transformed beam.

The first axicon element of the pair may alternatively be a negative refractive axicon which is arranged on the centre axis of the beam of pump radiation and configured to diverge the beam of pump radiation towards the second axicon element which may be a positive refractive axicon arranged on said centre axis and configured to collimate the beam to thereby produce said transformed beam.

The first axicon element of the pair may alternatively be a negative diffractive axicon which is arranged on the centre axis of the beam of pump radiation and configured to diverge the beam of pump radiation towards the second axicon element which may be a positive diffractive axicon arranged on said centre axis and configured to collimate the beam to thereby produce said transformed beam.

For reflective axicon elements and refractive axicon elements, each axicon of the pair of axicon elements may have substantially the same apex angle, $\tau$. The diffractive optical elements (DOE) axicon is defined not by an apex angle $\tau$ but a divergence angle, $\beta$. The divergence angle $\beta$ is equivalent to twice as the deflection angle ($2*\Upsilon$). For diffractive axicon elements, each axicon of the pair of axicon elements may have substantially the same divergence angle $\beta$. The axicon elements may be mounted on one or more movable mounts such that said axial separation, $D_1$, between the axicon elements is adjustable in use to control said adjustment setting.

The illumination source apparatus may further comprise a blocking element positioned after the HHG medium, the blocking element configured to suppress the residual transformed beam remaining after high harmonic generation, whilst substantially transmitting the generated high harmonic radiation.

The blocking element may be an output aperture aligned with the centre axis of the generated high harmonic radiation.

The focusing element may be configured to image the first axicon element onto the blocking element.

During use of the illumination source apparatus, the axial separation of the axicons, $D_1$, may be selected by means of the one or more movable mounts in order to optimize, for a given axicon apex angle $\tau$ or for a given axicon divergence angle $\beta$:

(A) the conversion efficiency of the high harmonic generation process; and/or (B) the suppression of the residual transformed beam.

The adjustable transformation optics may further comprise a variable beam expander/contractor configured to adjust the input waist size, $w_0$, of the beam of pump radiation, and wherein in use $w_0$ is selected in order to further optimize (A) and (B).

The transformed beam may be a collimated annular beam having an annulus radius $R_1$ and a ring width $R_2$ given by:

$R_1 = D_1 \tan(\gamma)$; and $R_2 = R_1 + w_0$, where the deflection angle $\gamma$ is given by equations (1) or (5) and (7) or (8) below in the detailed description, or is otherwise related to the axicon apex angle $\tau$ or axicon divergence angle $\beta$.

The adjustable transformation optics may further comprise an input aperture located on the centre axis of the beam of pump radiation, wherein the input aperture is positioned after the axicon elements and prior to the HHG medium with respect to the direction of propagation of the beam of pump radiation, and the focusing element is configured to image the input aperture onto the blocking element, and wherein in use the aperture size of the input aperture is selected in order to further optimize (A) and (B). The input aperture may be configured to adjust the ring width $R_2$.

According to a second aspect of the present invention there is provided a method of operating an illumination source apparatus, suitable for use in a metrology apparatus for the characterization of a structure on a substrate, the method comprising: providing a high harmonic generation, HHG, medium; operating a pump radiation source to emit a beam of pump radiation; and transforming, by adjustable transformation optics, the transverse spatial profile of the beam of pump radiation to produce a transformed beam such that relative to the centre axis of the transformed beam, a central region of the transformed beam has substantially zero intensity and an outer region which is radially outwards from the centre axis of the transformed beam has a non-zero intensity, wherein the transformed beam excites the HHG medium so as to generate high harmonic radiation, wherein the location of said outer region is dependent on an adjustment setting of the adjustable transformation optics.

The pump radiation source may emit a beam of pump radiation with a Gaussian transverse spatial profile, and the adjustable transformation optics may produce a transformed beam with a non-Gaussian or annular transverse spatial profile.

The method according to the second aspect of the present invention may further comprise focusing the transformed beam into the HHG medium using a focusing element positioned between the adjustable transformation optics and the HHG medium.

The adjustable transformation optics may comprise a pair of axicon elements consisting of a first axicon element and a second axicon element, wherein the first axicon element precedes the second axicon element relative to the propagation direction of the beam of pump radiation and wherein the axial separation between the first axicon element and the second axicon element is adjusted to control said adjustment setting of the adjustable transformation optics.

For reflective axicon elements and refractive axicon elements, each ach axicon of the pair of axicon elements may have substantially the same apex angle, $\tau$. The diffractive optical elements (DOE) axicon is defined not by an apex angle $\tau$ but a divergence angle, $\beta$. For diffractive axicon elements, each axicon of the pair of axicon elements may have substantially the same divergence angle, $\beta$. The axicon elements may be mounted on one or more movable mounts, and the method may further comprise adjusting the axial separation, $D_1$, between the axicon elements to control said adjustment setting.

The method according to the second aspect may further comprise suppressing, using a blocking element positioned after the HHG medium, the residual transformed beam remaining after high harmonic generation, whilst substantially transmitting the generated high harmonic radiation. The first axicon element may be imaged onto the blocking element using the focusing element.

The method may further comprise selecting the axial separation, $D_1$, between the axicon elements in order to optimize:

(A) the conversion efficiency of the high harmonic generation process; and/or (B) the suppression of the residual transformed beam.

The method may further comprise adjusting the input waist size, $w_0$, of the beam of pump radiation using a variable beam expander/contractor, in order to further optimize (A) and (B).

The adjustable transformation optics may further comprise an input iris located on the centre axis of the beam of pump radiation, wherein the input iris is positioned after the axicon elements and prior to the HHG medium with respect to the direction of propagation of the beam of pump radiation, and the focusing element is configured to image the input iris onto the blocking element, and wherein the aperture size of the input iris is selected in order to further optimize (A) and (B).

According to a third aspect of the present invention there is provided a computer program comprising instructions which, when executed on at least one processor, cause the at least one processor to control an apparatus to carry out a method according to the second aspect of the invention.

According to a fourth aspect of the present invention there is provided a carrier containing the computer program according to third aspect, wherein the carrier is one of an electronic signal, optical signal, radio signal, or non-transitory computer readable storage medium.

According to a fifth aspect of the present invention there is provided a lithographic apparatus comprising the illumination source apparatus according to the first aspect of the invention.

According to a sixth aspect of the invention there is provided a lithographic cell comprising the lithographic apparatus according to the fifth aspect of the invention.

According to a seventh aspect of the present invention there is provided a metrology apparatus comprising an illumination source apparatus according to the first aspect of the invention.

According to an eighth aspect of the present invention there is provided a lithographic cell comprising a metrology apparatus according to the seventh aspect of the invention.

The present invention aims to provide improved output power of a high harmonic generation, HHG, illumination source apparatus used to produce soft X-ray and/or EUV radiation for use in a metrology tool. The invention achieves this through enabling improved conversion efficiency and reduced reliance on metal filters for suppressing the residual pump radiation.

BRIEF DESCRIPTION OF THE DRAWINGS

Embodiments will now be described, by way of example only, with reference to the accompanying drawings in which.

DETAILED DESCRIPTION OF EXEMPLARY EMBODIMENTS

Before describing embodiments of the invention in detail, it is instructive to present an example environment in which embodiments of the present invention may be implemented.

In the present document, the terms "radiation" and "beam" are used to encompass all types of electromagnetic radiation, including ultraviolet radiation (e.g. with a wavelength of 365, 248, 193, 157 or 126 nm), EUV (extreme ultra-violet radiation, e.g. having a wavelength in the range of about 1-100 nm) and/or soft X-ray radiation (e.g. radiation in a wavelength range from 0.1 to 10 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
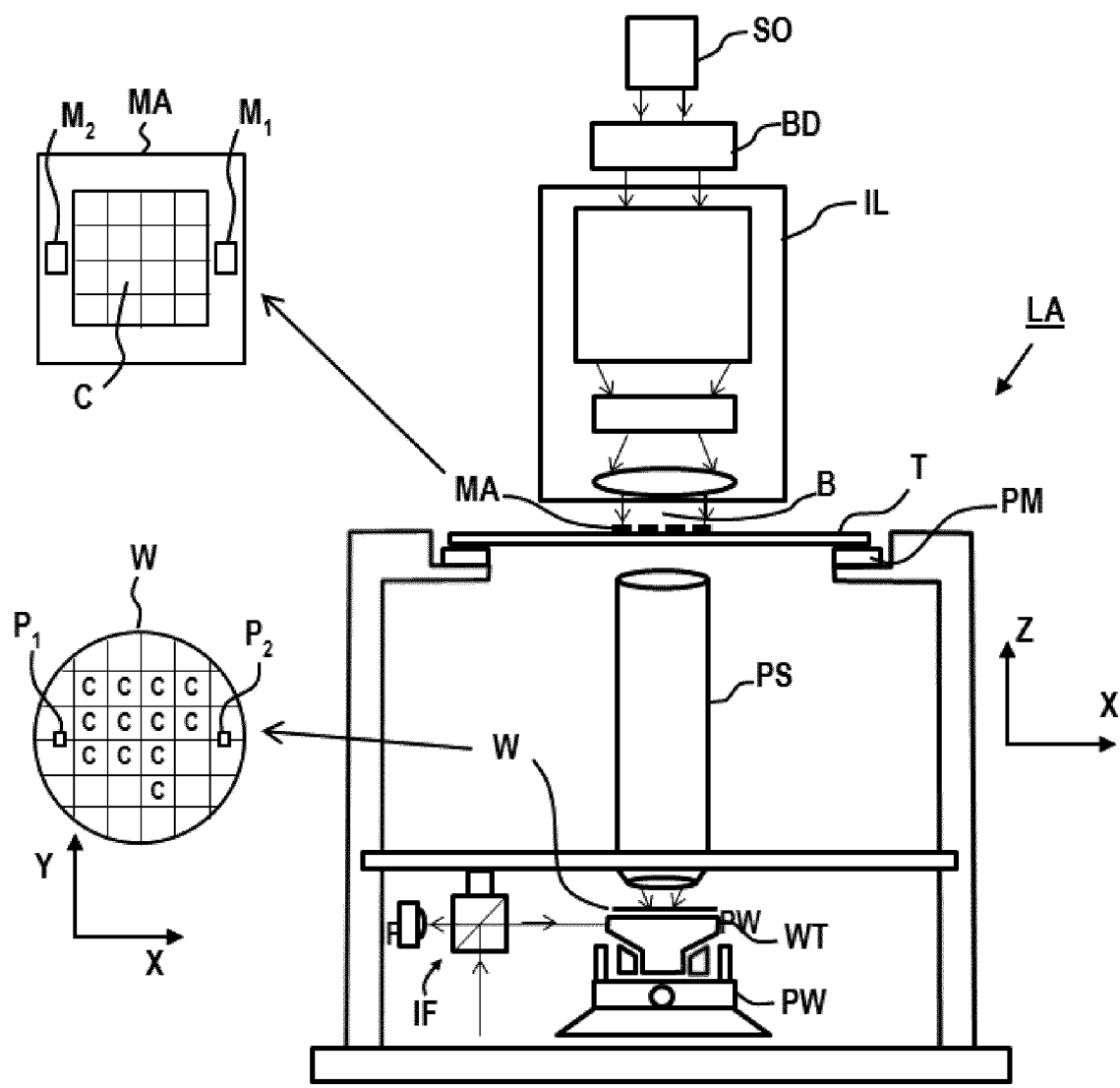
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
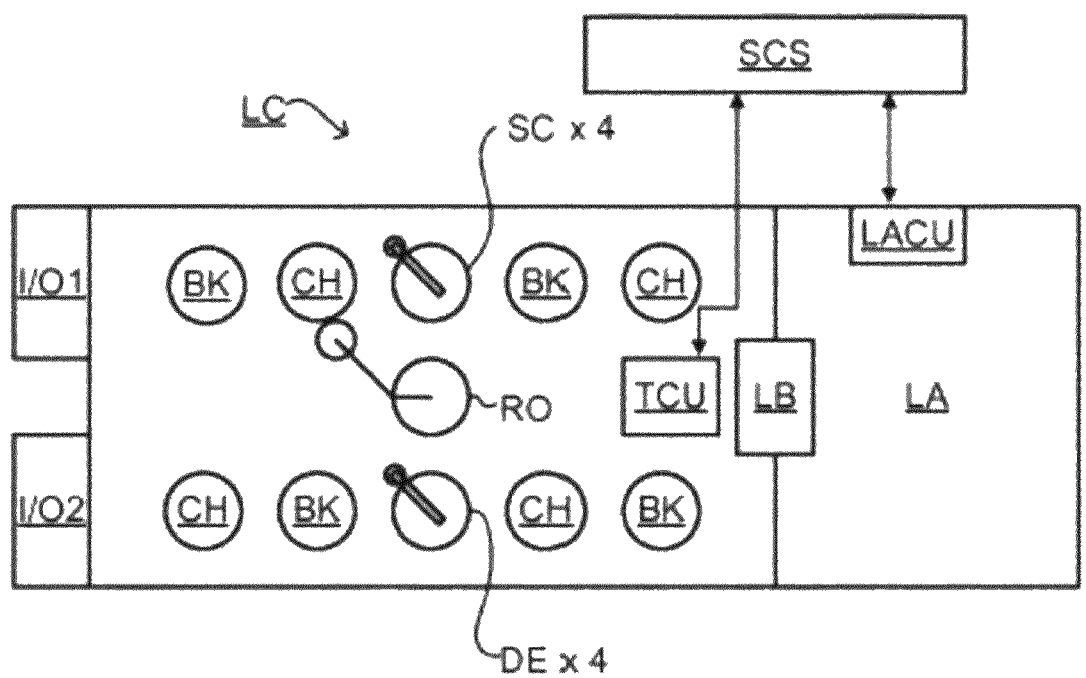
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
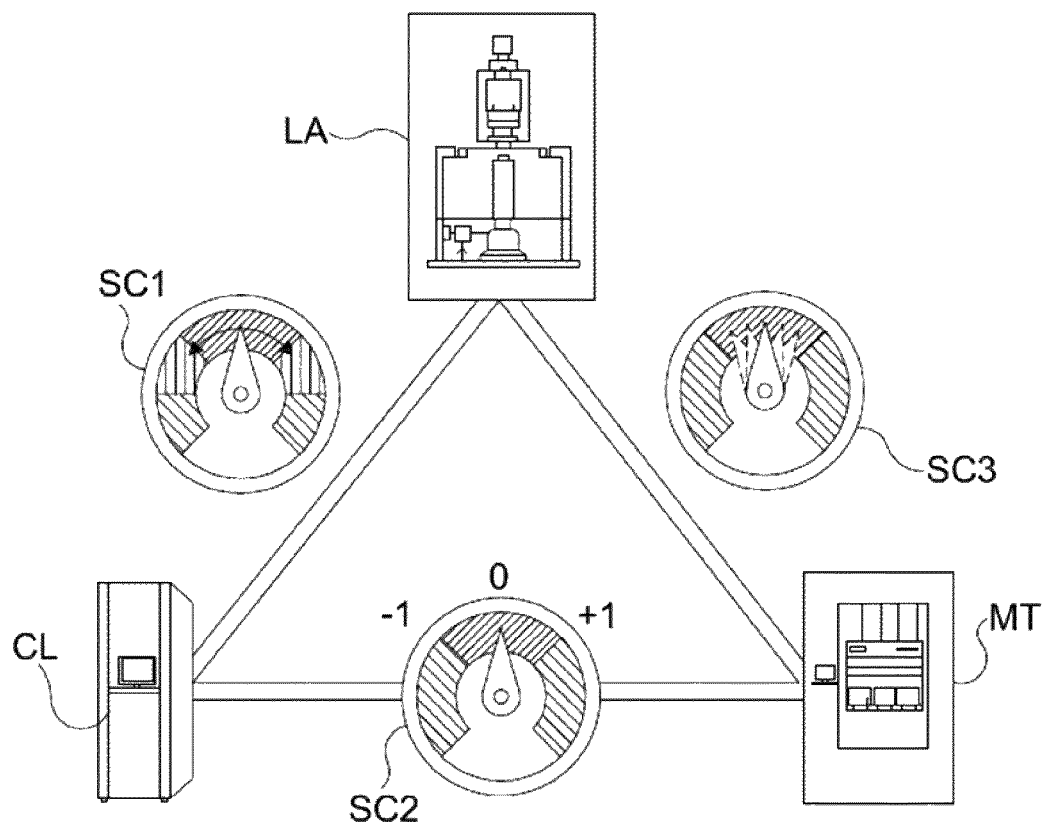
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to frequently make measurements of the structures created, e.g., for process control and verification. Tools to make such measurements are typically called metrology tools MT. Different types of metrology tools MT for making such measurements are known, including scanning electron microscopes or various forms of scatterometer metrology tools MT.

Scatterometers are versatile instruments which allow measurements of the parameters of a lithographic process by having a sensor in the pupil or a conjugate plane with the pupil of the objective of the scatterometer, measurements usually referred to as pupil based measurements, or by having the sensor in the image plane or a plane conjugate with the image plane, in which case the measurements are usually referred to as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray, Extreme Ultraviolet (EUV) and visible to near-IR wavelength range.

A first type of scatterometer is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

A second type of scatterometer is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation (i.e. the 0th order). From this data, the structure or profile of the target giving rise to the detected spectrum may be reconstructed, e.g. by Rigorous Coupled Wave Analysis and non-linear regression or by comparison with a library of simulated spectra.

A third type of scatterometer is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033, 135, 13/533,110 and 13/891,410 incorporated herein by reference in their entirety.

The scatterometer MT may be adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in patent application EP1,628,164A, the entire contents of which are incorporated herein by reference, such that any asymmetry is clearly distinguishable. This provides a straightforward way to measure misalignment in gratings. Further examples for measuring overlay error between the two layers containing periodic structures as target through asymmetry of the periodic structures may be found in PCT patent application publication no. WO 2011/012624 or US patent application US 20160161863, incorporated herein by reference in its entirety.

Other parameters of interest may be focus and dose and more in particular the focus and dose being used by the lithographic apparatus while printing a pattern on a substrate. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch processing for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an under-filled mode or in an overfilled mode. In the under-filled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and not yet published U.S. patent application Ser. No. 15/181,126, incorporated herein by reference in its entirety.

As an alternative to optical metrology methods, it has also been considered to use soft X-rays and/or EUV radiation, for example radiation in a wavelength range between 0.1 nm and 100 nm, or optionally between 1 nm and 50 nm or optionally between 10 nm and 20 nm. One example of a metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays and/or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent applications are incorporated herein by reference in their entirety.

Figure 4:
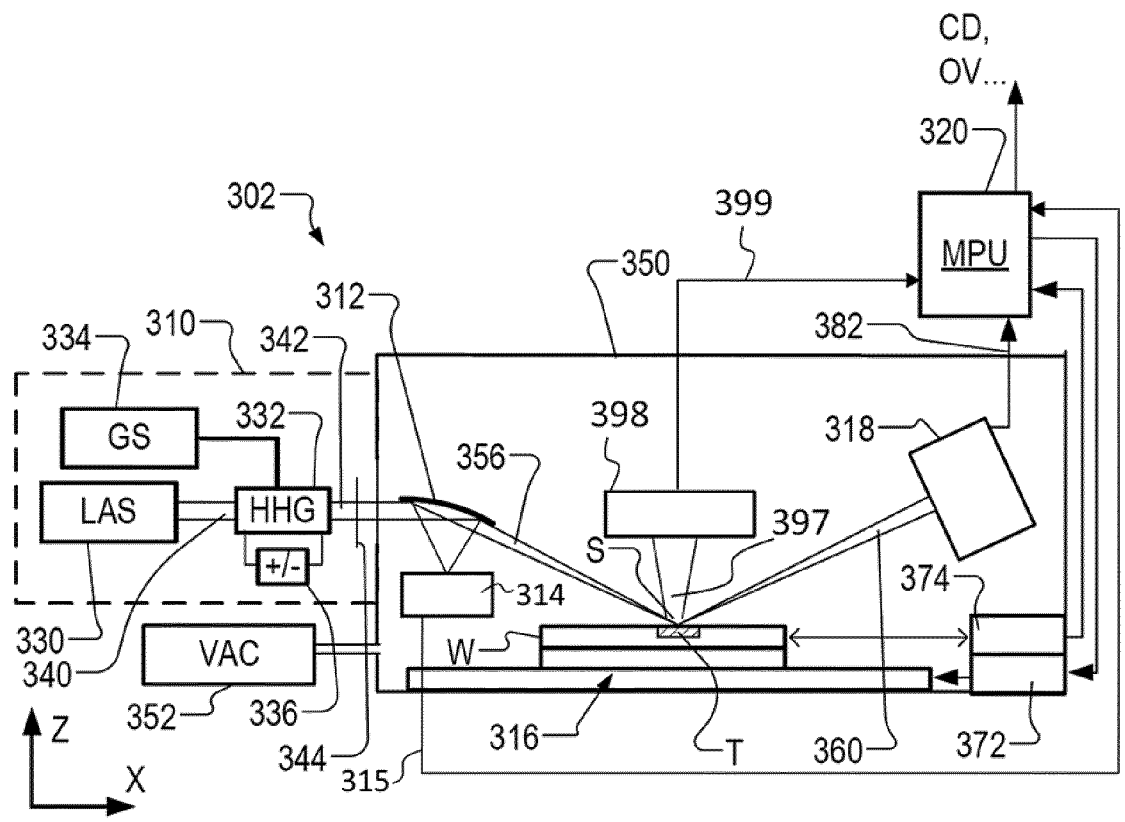
FIG. 4 depicts a schematic representation of a metrology apparatus in which radiation in the wavelength range from 0.1 nm to 100 nm may be used to measure parameters/characteristics of structures on a substrate.

FIG. 4 depicts a schematic representation of a metrology apparatus 302 in which radiation in the wavelength range from 0.1 nm to 100 nm may be used to measure parameters of structures on a substrate. The metrology apparatus 302 presented in FIG. 4 is suitable for the soft X-rays and/or EUV domain.

FIG. 4 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source 310, illumination system 312, substrate support 316, detection systems 318, 398 and metrology processing unit (MPU) 320.

Source 310 in this example comprises a generator of EUV and/or soft x-ray radiation based on high harmonic generation (HHG) techniques. Such sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). $N_2$, $O_2$, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (ZR) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation can pass without undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 µm in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 4, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 4 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Figure 5:
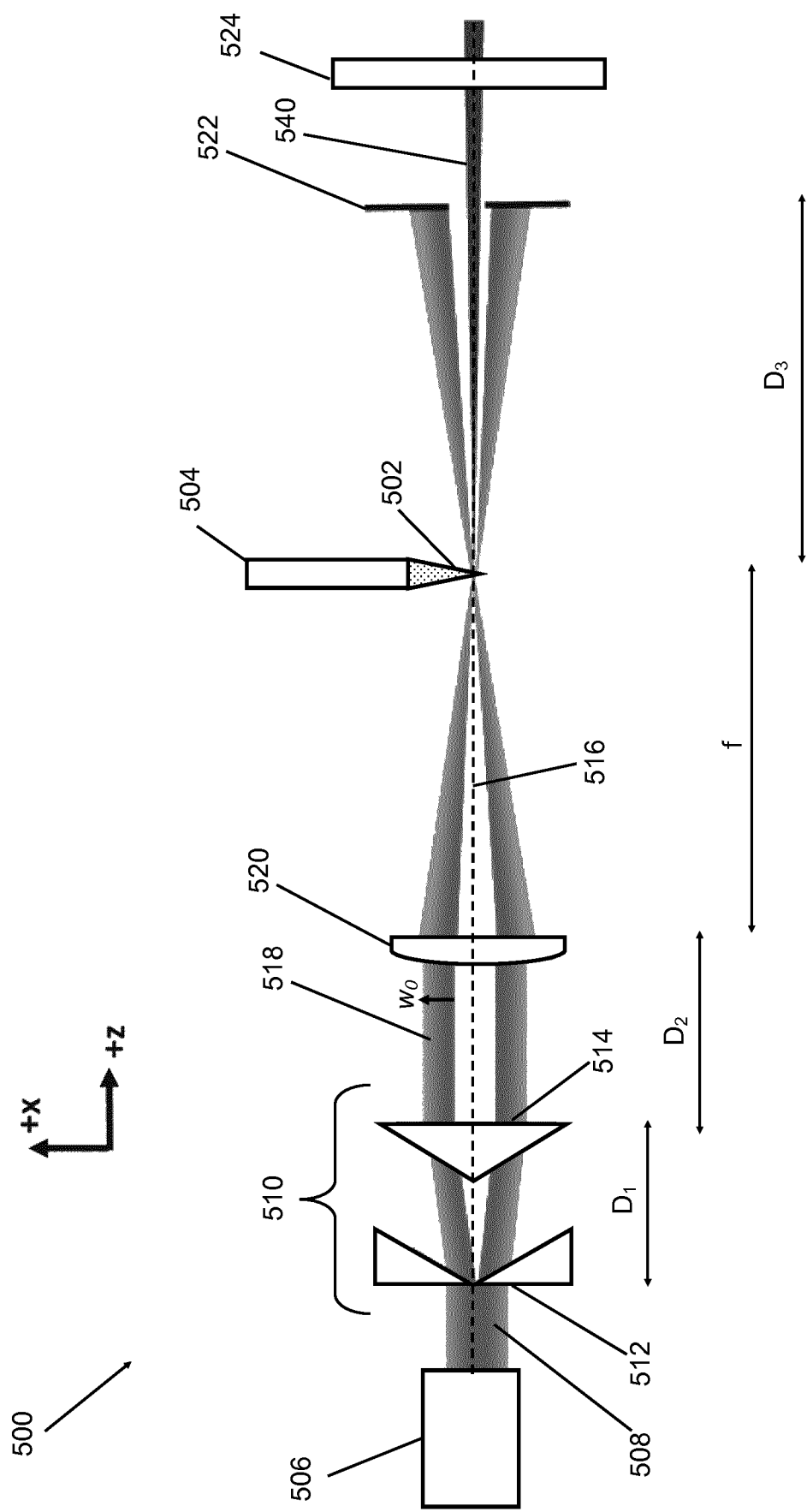
FIG. 5 depicts an illumination source apparatus according to a first embodiment of the invention.

FIG. 5 illustrates an illumination source apparatus 500 according to a first embodiment of the invention. The illumination source apparatus may be used in a metrology apparatus, such as that described above with reference to FIG. 4. The illumination source apparatus comprises a high harmonic generation, HHG, medium 502 delivered by a gas nozzle 504. A pump radiation source 506 is operable to emit a beam of pump radiation 508. The beam of pump radiation emitted by the pump radiation source typically has a Gaussian transverse spatial profile with a beam waist denoted $w_0$. Unlike conventional HHG sources where the Gaussian beam of pump radiation is focused directly into the HHG medium for conversion, according to embodiments of the invention, the beam of pump radiation is first incident upon a set of adjustable transformation optics, shown generally at 510 in FIG. 5. The purpose of the adjustable transformation optics is to adjustably transform the transverse spatial profile of the beam of pump radiation to produce a transformed beam having a different transverse spatial profile.

Figure 14A:
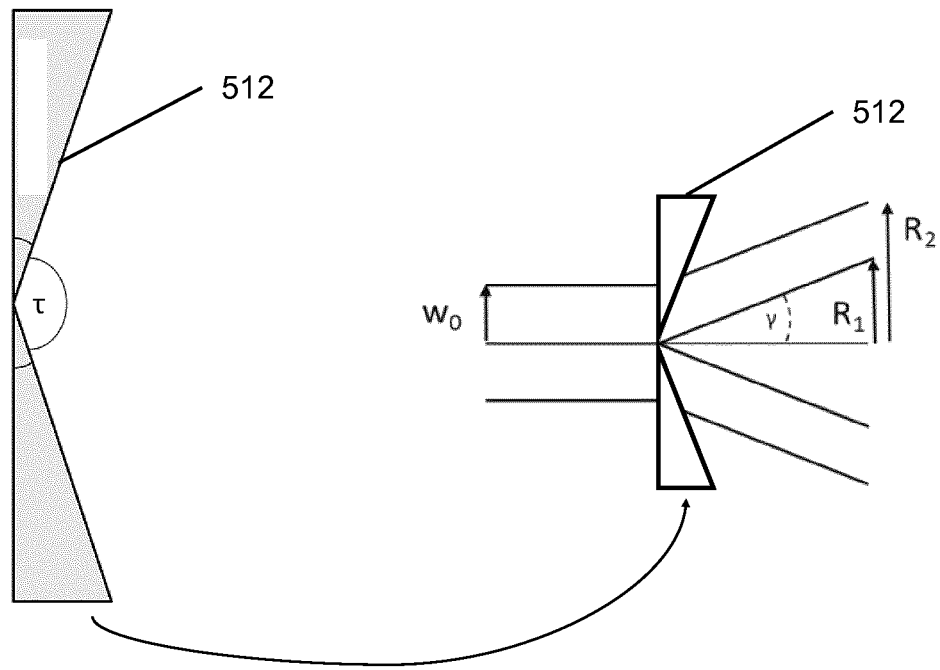
FIGS. 14a and 14b depict negative and positive refractive axicon elements and their influence on an incident beam of radiation.

According to this embodiment, the adjustable transformation optics 510 comprise a pair of refractive axicon elements 512, 514 of equal apex angle τ. The refractive axicon elements are placed in series with an axial separation distance $D_1$. A refractive axicon is a conical optical element which may be either positive (convex) or negative (concave). Refractive axicon elements are characterized by an apex angle τ and the refractive index of the medium forming the axicon element. The properties of negative and positive refractive axicons are described in detail with reference to FIGS. 14a and 14b respectively. By "refractive" it is to be understood that the elements operate in transmission and are formed of a material having a refractive index generally greater than or less than that of the medium surrounding the axicon element. With reference to FIG. 14a, the negative (concave) refractive axicon element is characterized by an apex angle τ and is formed of a medium having a refractive index denoted $n_{axicon}$ which may be in the range from 1.4 to 1.6. The refractive index of the surrounding medium (e.g. air or vacuum) is denoted n and is typically 1.0. The angle at which incident parallel rays of light/radiation are deflected away from the optical axis is denoted γ and is given by the expression:

$$\gamma = \left(\frac{n_{axicon} - n}{n}\right)\left(\frac{\pi \pm \tau}{2}\right). \quad (1)$$

Figure 14B:
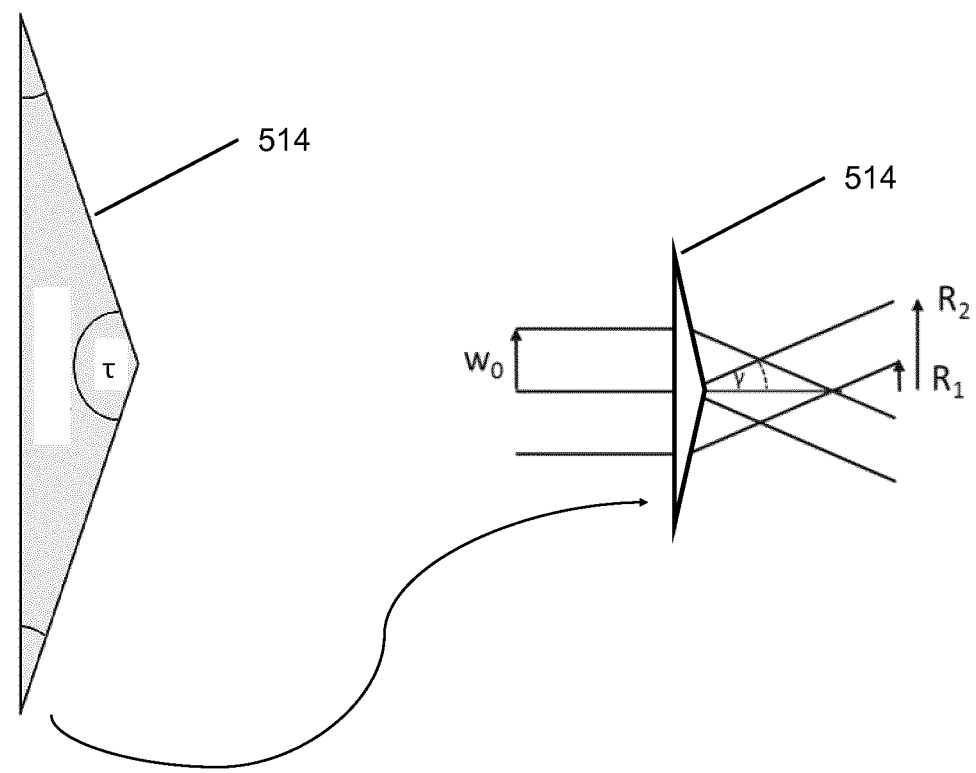

With reference to FIG. 14b, the positive (convex) refractive axicon element is also characterized by an apex angle τ and is also formed of a medium having a refractive index denoted $n_{axicon}$ which may be in the range from 1.4 to 1.6. An equivalent deflection angle γ arises also for the case of a positive axicon, as is apparent from FIG. 14b, and can be considered to be the angle at which an incident ray of light/radiation is deflected towards the optical axis. This is defined by the same equation (1) above.

In the embodiment shown in FIG. 5, the first axicon element 512 of the adjustable transformation optics 510, relative to the direction of propagation of the beam of pump radiation, i.e. from left to right in FIG. 5, is a negative (concave) refractive axicon element. The effect of the first axicon element on the incident beam of pump radiation is to bend it away from the optical axis 516 which is also the centre axis of the beam of pump radiation and shown as the +z direction in FIG. 5. Since the first axicon element is on axis, the beam of pump radiation diverges away from the optical axis as a hollow ring of light, increasing in radius linearly with distance along the positive z direction. The second axicon element 514 is a positive (convex) refractive axicon element placed at an axial separation distance $D_1$ from the first axicon element. The second axicon element bends the beam back towards the optical axis 516 (substantially) canceling out the divergence imparted by the first axicon element, thereby resulting in a collimated annular beam 518 referred to herein as the "transformed beam". The divergence is canceled out since the first and second axicon elements have equal but opposite apex angles τ. Alternatively, it is envisaged that the two axicon elements could have slightly different apex angles thereby resulting in a non-collimated annular beam. In this case, the focusing element 520, discussed below, could be configured to at least partially compensate for the non-collimated nature of the annular beam. One or both of the axicons is mounted on a movable mount to allow the separation $D_1$ in the z direction, i.e. along the optical axis, to be adjusted.

Figure 6:
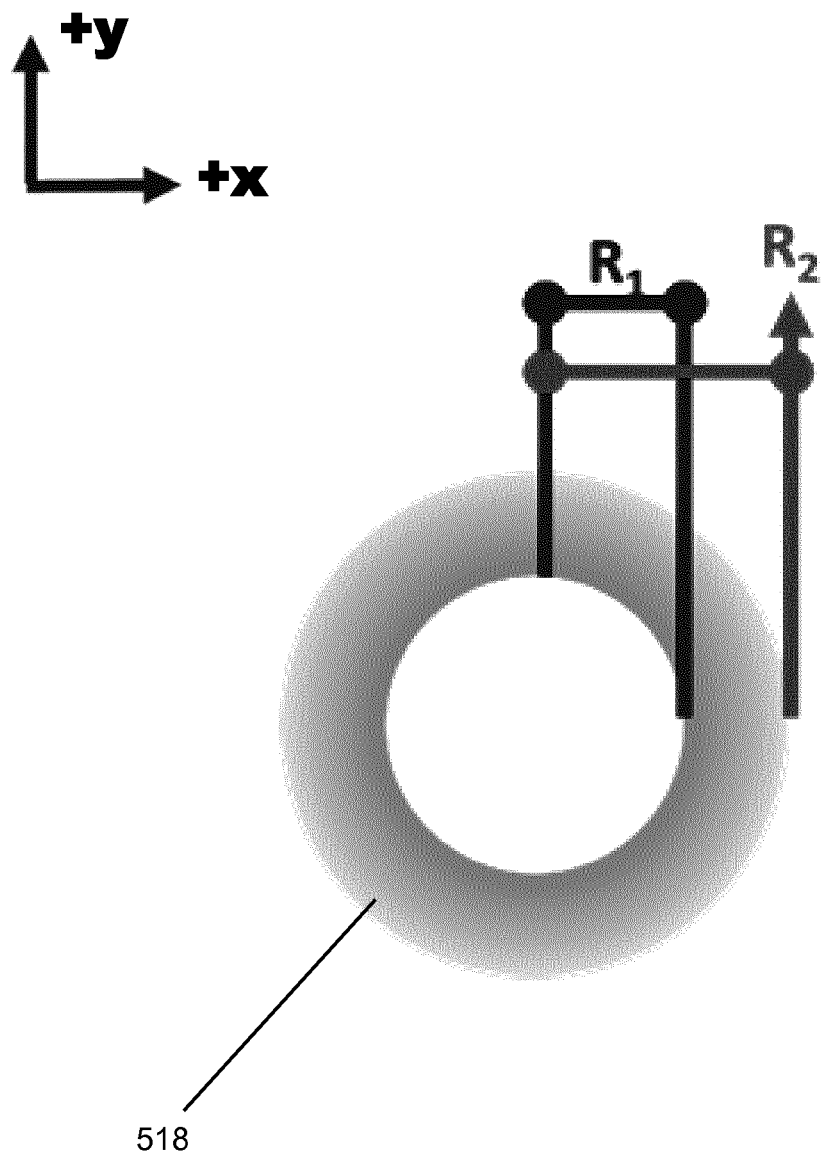
FIG. 6 depicts a sample transverse intensity profile in the (x, y) plane for a transformed beam produced in the illumination source apparatus.

A sample transverse intensity profile in the (x, y) plane is show in FIG. 6. The resulting annular beam 518 is characterized by the inner ring radius $R_1$ and the outer ring radius $R_2$. The Gaussian tail from the original pump beam remains on the outside of the annular beam, whilst the inner edge of the annular beam is sharp. The transformed beam 518 has radii $R_1$ and $R_2$ given by:

$$R_1 = D_1 \tan \gamma; \quad (2)$$

$$R_2 = R_1 + w_0, \quad (3)$$

where the angle γ is the angle at which radiation is deflected away from, or towards, the optical axis as defined above in equation (1) and in equation (5).

In this manner, since the transformation optics produce a transformed beam resembling a collimated annular beam, relative to the centre axis of the transformed beam, a central region of the transformed beam has substantially zero intensity and an outer region—which is radially outwards from the centre axis of the transformed beam—has a non-zero intensity. The location of the outer region which has non-zero intensity is dependent on an adjustment setting of the adjustable transformation optics. For example, in this embodiment it is dependent on the separation distance $D_1$ between the first and second axicons. This separation distance is adjustable using the one or more movable mounts as described above.

Between the transformation optics and the HHG medium is a focusing element 520 which focuses the transformed beam 518 into the HHG medium. The focusing element is located at a distance $D_2$ from the second axicon element. The transformed beam is arranged to excite the HHG medium so as to generate high harmonic radiation, rather than exciting the HHG medium with the original Gaussian beam of pump radiation as is the case in conventional HHG sources. In this embodiment the focusing element is a lens 520 having focal length f. The focal plane of the lens is positioned substantially in the HHG medium. In this manner, since the transformed beam before the lens is collimated, the transformed beam is focused by the lens to a high intensity spot substantially in the HHG medium where soft x-ray and/or EUV radiation is generated.

The portion of the transformed beam which is not converted to soft x-ray radiation and/or EUV in the HHG process propagates away from the focal spot and will reform the hollow annular intensity profile in the far field. On the other hand, the generated high harmonic (soft x-ray and/or EUV) radiation, 540, will propagate substantially along the optical axis and not form a hollow annular beam. This is because at the focus, the transformed beam has a similar field distribution to a Gaussian beam. Since the generated soft x-ray and/or EUV radiation and residual transformed beam become spatially separated in the far field, a passive blocking element 522 is positioned after the HHG medium and is used to block/suppress the residual transformed beam remaining after HHG, whilst substantially transmitting the generated soft x-ray and/or EUV radiation for use in e.g. a metrology apparatus. In this embodiment, the blocking element is an output aperture 522 aligned with the centre axis of the generated high harmonic radiation. The distance between the focal plane of the lens and the output aperture is $D_3$. Any remaining pump radiation from the transformed beam after the output aperture may optionally be filtered out by a Zirconium filter 524.

The location of the first axicon element 512 is chosen such that it is in the conjugate image plane of the output aperture 522. This imaging relationship has proven to be optimal for suppression of the residual transformed beam by means of the output aperture. According to the thin lens formula, the relation between the distances in FIG. 5 is thus:

$$\frac{1}{(D_1 + D_2)} + \frac{1}{(f + D_3)} = \frac{1}{f} \quad (4)$$

Figure 7:
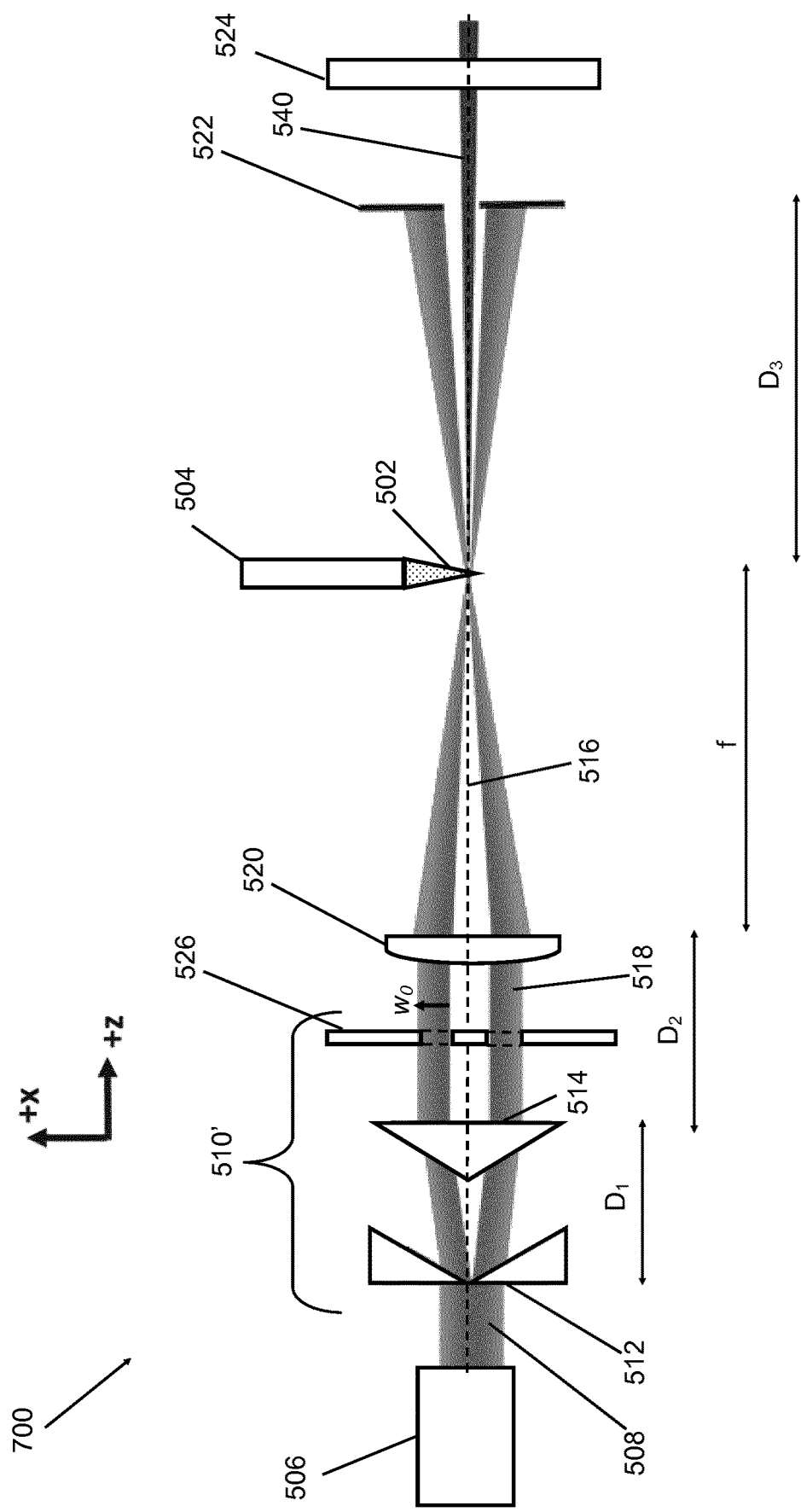
FIG. 7 depicts an illumination source apparatus according to a second embodiment of the invention.

FIG. 7 illustrates an illumination source apparatus 700 according to a second embodiment of the invention. This embodiment is identical to the first embodiment shown in FIG. 5 except that according to this embodiment an additional optical element in the form of an input aperture 526 is provided and forms part of the transformation optics, shown generally at 510'. The input aperture is located on the centre axis of the beam of pump radiation 516 and is positioned after the first and second axicon elements and prior to the HHG medium with respect to the direction of propagation of the beam of pump radiation. In this embodiment, the lens 520 is configured to image the input aperture 526 onto the blocking element 522, compared to the first embodiment where the lens is configured to image the first axicon element onto the blocking element. In use, the aperture size of the input aperture is selected in order to enable control over the outer ring radius $R_2$. This enables the inner and outer ring radii, $R_1$ and $R_2$ respectively, to be independently tuned by adjusting the axicon separation $D_1$ and the input aperture size to control $R_2$.

Figure 8:
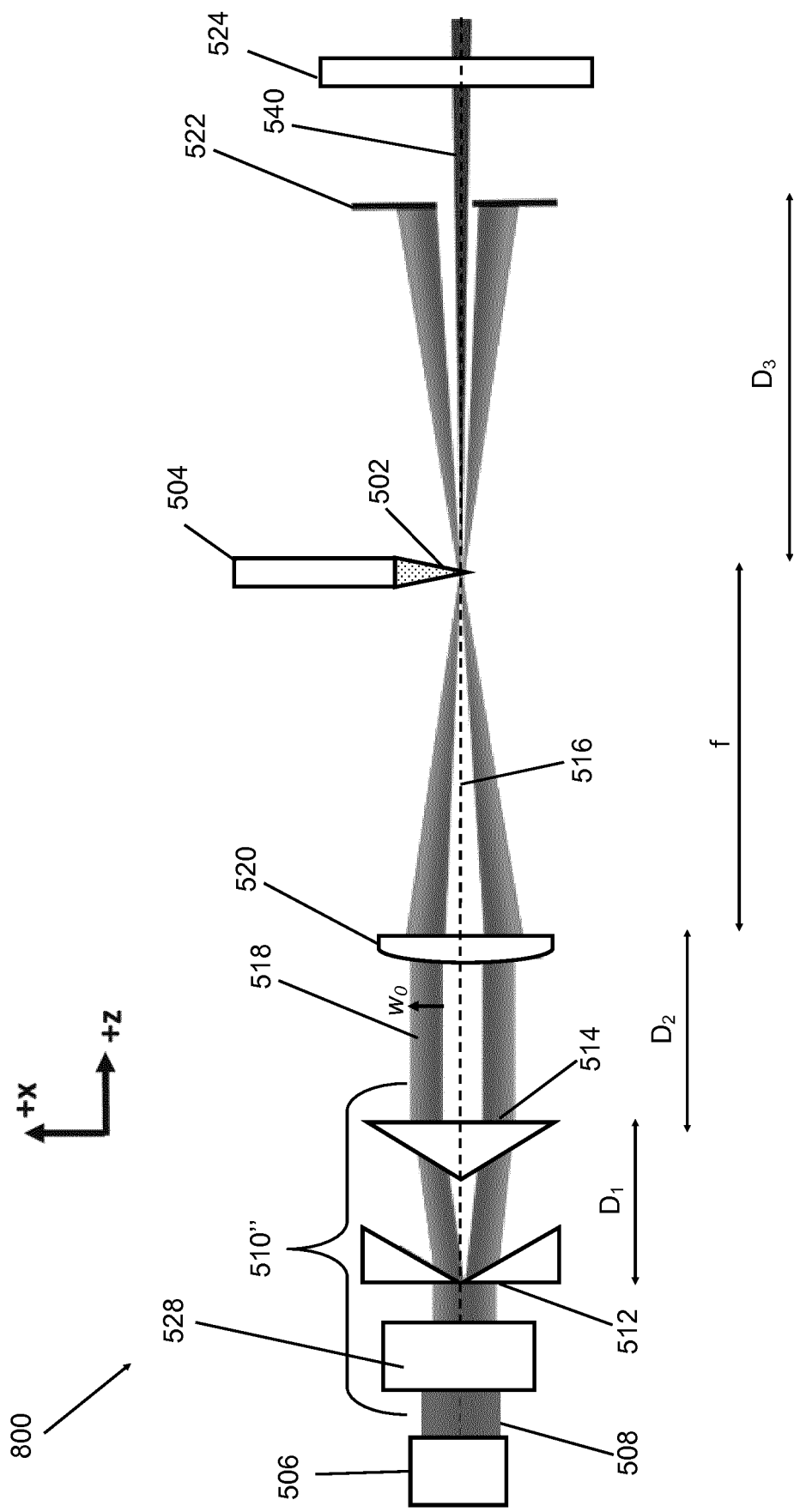
FIG. 8 depicts an illumination source apparatus according to a third embodiment of the invention.

FIG. 8 illustrates an illumination source apparatus 800 according to a third embodiment of the invention. This embodiment is identical to the first embodiment shown in FIG. 5 except that it additionally includes a variable beam expander/contractor 528 before the pair of axicon elements. The variable beam expander/contractor thus forms part of the transformation optics, shown generally at 510". The variable beam expander/contractor could be a telescope, for example. The variable beam expander/contractor 528 enables the waist size $w_0$ of the beam of pump radiation to be adjusted prior to manipulation by the pair of axicon elements. This enables the inner and outer ring radii, $R_1$ and $R_2$ respectively, to be independently tuned by adjusting the axicon separation $D_1$ and the input pump beam waist $w_0$, as can be seen from the relations shown in equations (2) and (3).

Figure 9:
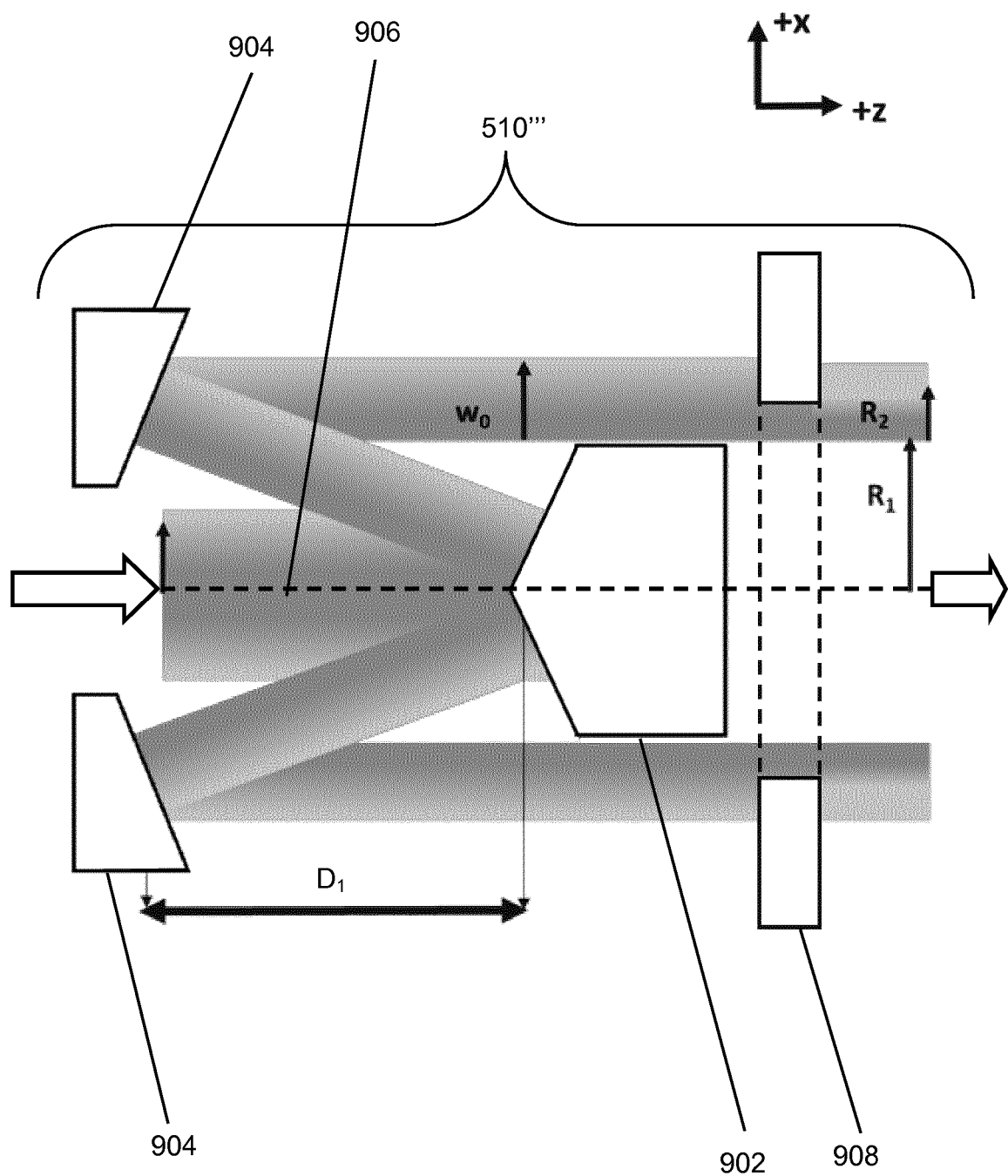
FIG. 9 depicts the transformation optics of an illumination source apparatus according to a fourth embodiment of the invention.

FIG. 9 illustrates the transformation optics part 510''' of an illumination source apparatus according to a fourth embodiment of the invention. This embodiment uses a pair of reflective axicon elements 902, 904 instead of a pair of refractive axicon elements as described above with reference to the first three embodiments of the invention. According to this embodiment, the first axicon element 902 is a negative (convex) reflective axicon which is arranged with its tip on the centre axis 906 of the beam of pump radiation and which is configured to reflect the beam of pump radiation towards the second axicon element 904 which is an annular reflective concave axicon configured to collimate the beam to thereby produce said transformed beam. Since the second axicon element 904 is annular, the input beam of pump radiation can pass through the centre of the second axicon element in order to reach the first axicon element.

Figure 10A:
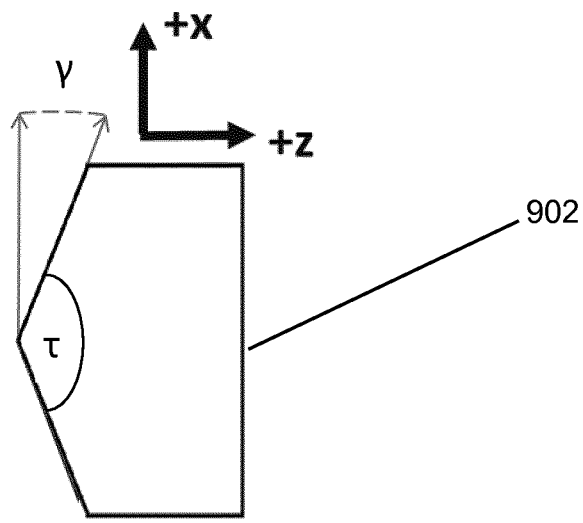
FIGS. 10a to 10c depict axicon elements used in the fourth embodiment.

The axicon elements 902 and 904 have equal apex angles τ. The first axicon element 902 is shown in more detail in FIG. 10a. The first axicon element 902 has an apex angle τ and is rotationally symmetric around the tip of the cone. The tip of the cone is centred along the optical axis 906. In this manner, the beam of pump radiation which propagates along the same optical axis in the +z direction is reflected at a fixed and constant angle γ away from the optical axis in the direction opposite to the incident propagation direction, i.e. in the −z direction, where:

$$\gamma = \frac{(\pi \pm \tau)}{2}. \quad (5)$$

Figure 10B:
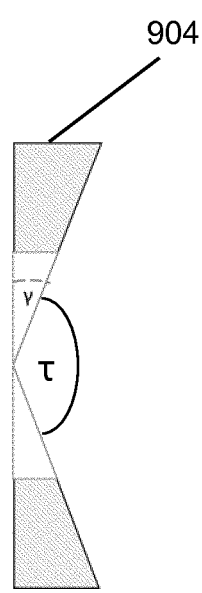
Figure 10C:
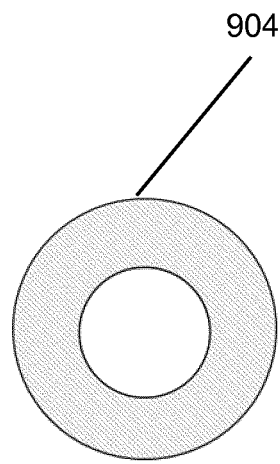

The reflected beam will form a diverging hollow annular beam, with an inner radius $R_1$ increasing with distance $D_1$ from the first axicon element according to equation (2). The radial ring width of the annular beam is half the incident beam diameter, or in the case that the beam of pump radiation is a collimated Gaussian beam, this is the same as the pump beam waist $w_0$. The outer ring radius $R_2$ is given by equation (3). The second axicon reflector element 904 is a positive (concave) reflective axicon and has the same apex angle τ as the first element, and is shown in more detail in FIG. 10b. This element is an annular mirror with a circularly symmetric fixed-angle surface. The central region of the element is hollow to allow the unhindered transmission of the initial beam of pump radiation into the transformation optics 510''', as shown in the plan view of FIG. 10c. The annular reflector is used to collect the light reflected from the first axicon element. The angle of the reflective surface is such that is corrects for the diverging cone, forming a collimated annular beam. After the second axicon element, an additional optical element in the form of an input aperture 908 is provided. The input aperture is located on the centre axis of the beam of pump radiation and is positioned after the first and second axicon elements and prior to the HHG medium with respect to the direction of propagation of the beam of pump radiation. In this embodiment, the lens (not shown) is configured to image the input aperture 908 onto the blocking element. The arrangement after the transformation optics 510''' is structurally the same as that shown in FIGS. 5, 7 and 8. In use, the aperture size of the input aperture is selected in order to enable control over the outer ring radius $R_2$. This enables the inner and outer ring radii, $R_1$ and $R_2$ respectively, to be independently tuned by adjusting the axicon separation $D_1$ and the input aperture size to control $R_2$. Alternatively, this embodiment may use a variable beam expander/contactor instead of or in addition to the input aperture 908. The variable beam expander/contractor would function in the manner described above with reference to the third embodiment. Alternatively, this embodiment, and all other embodiments, may not include a variable beam expander/contractor or input aperture, if sufficient control over the input beam waist $w_0$ is possible directly from the source of pump radiation.

Figure 15:
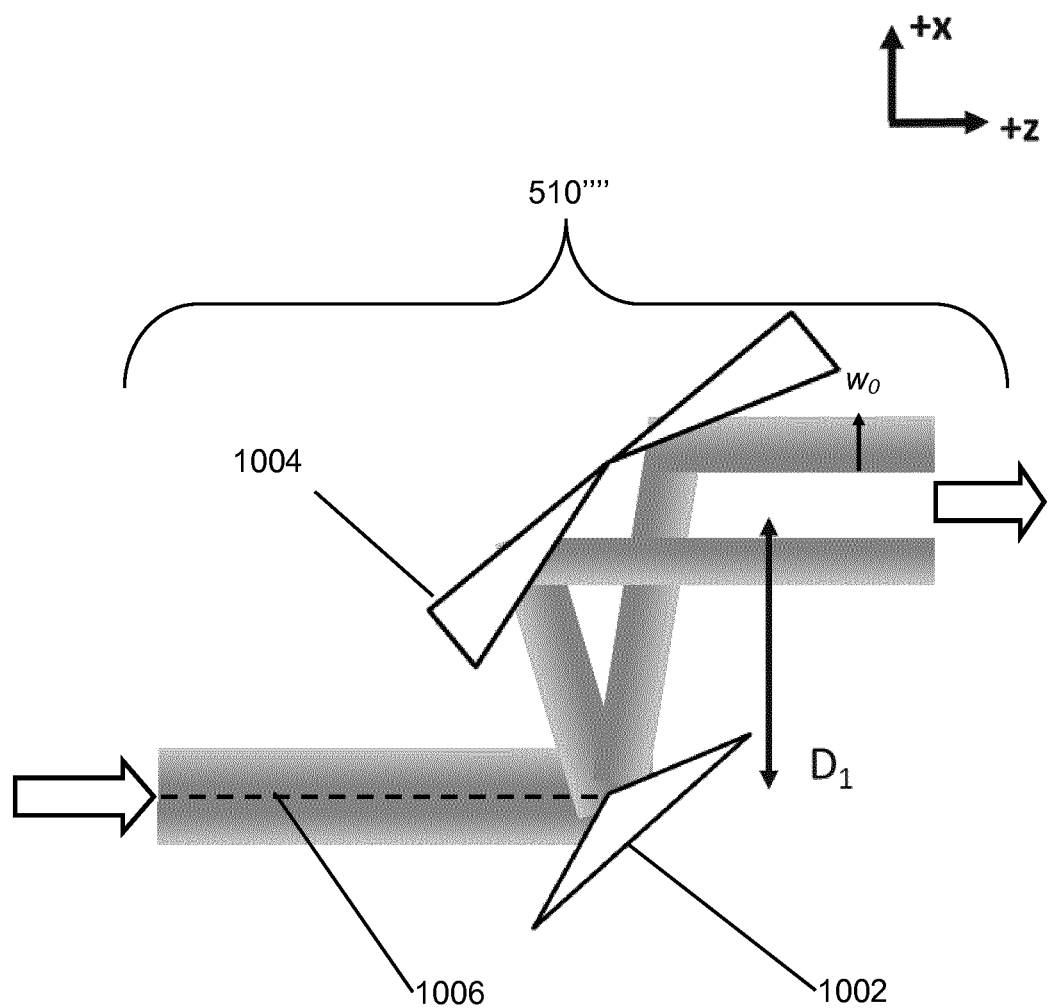
FIG. 15 depicts the transformation optics of an illumination source apparatus according to a fifth embodiment of the invention.

FIG. 15 illustrates the transformation optics part 510'''' of an illumination source apparatus according to a fifth embodiment of the invention. This embodiment is similar to the fourth embodiment described with reference to FIG. 9 because it also uses a pair of reflective axicon elements 1002 and 1004 in the transformation optics, as opposed to refractive axicon elements. According to this embodiment, the first axicon element 1002 is a negative (convex) reflective axicon which is arranged with its tip on the centre axis 1006 of the beam of pump radiation but angled at 45 degrees to the optical axis. In this manner the first axicon element 1002 reflects the beam of pump radiation towards the second axicon element 1004 which is a positive (concave) reflective axicon configured to collimate the beam to thereby produce said transformed beam. The second axicon element is also angled at 45 degrees to the optical axis 1006 and is parallel to the first axicon element. The axicon elements 1002 and 1004 have equal apex angles τ. Unlike the fourth embodiment, in this embodiment the second axicon element does not have an annular geometry since the input beam of pump radiation does not pass through the second axicon element in order to reach the first axicon element. In many aspects this embodiment functions in the same manner as the fourth embodiment, and equation (5) defines the deflection angle γ and equations (2) and (3) determine the annular beam radii in dependence on γ, the axicon separation $D_1$, and input pump beam waist $w_0$.

Figure 16:
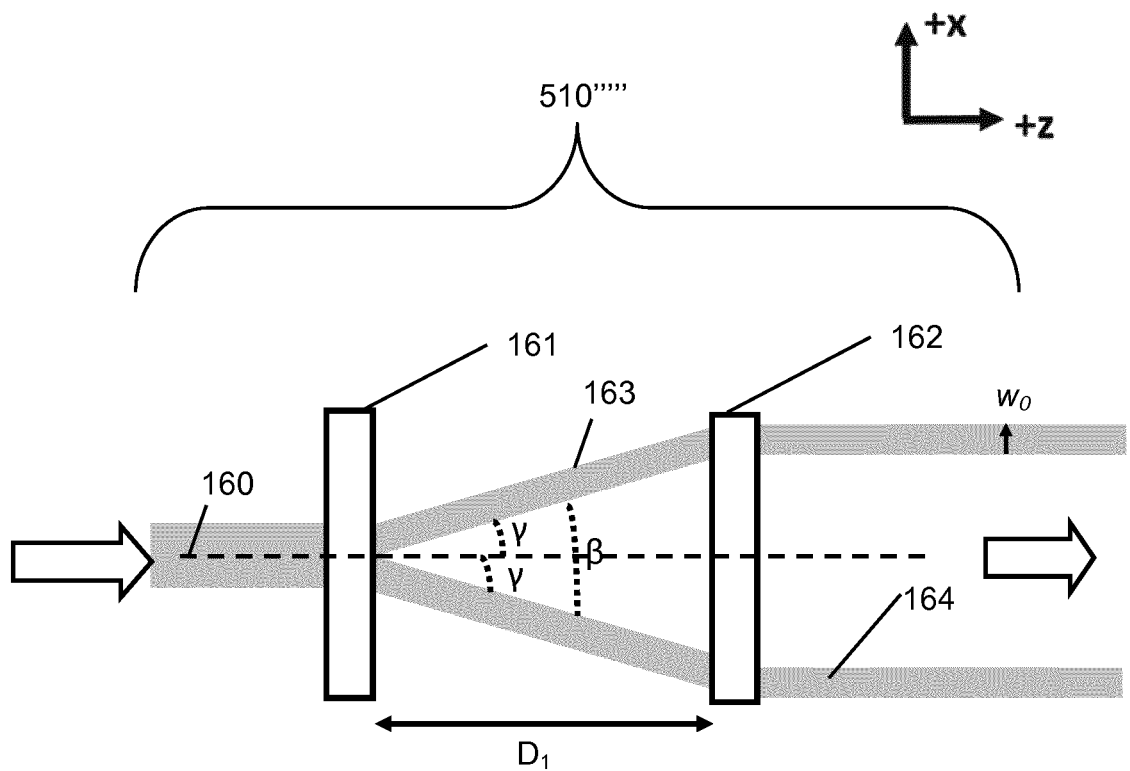
FIG. 16 depicts an illumination source apparatus according to a sixth embodiment of the invention.

FIG. 16 illustrates the transformation optics part 510''''' of an illumination source apparatus according to a sixth embodiment of the invention. This embodiment uses a pair of diffractive optical element (DOE) axicons 161 and 162 in the transformation optics, as opposed to refractive and reflective axicon elements. According to this embodiment, the first diffractive axicon element 161 is a negative (convex) DOE which is arranged on the centre axis 160 of the beam of pump radiation. In this manner the first DOE 161 diffracts the beam of pump radiation towards the second DOE axicon 162 which is a positive (concave) DOE configured to collimate the beam to thereby produce said transformed beam. The diffractive axicon elements 161 and 162 have equal but opposite divergence angle β. In many aspects this embodiment functions in the same manner as the first embodiment, and equation (7) defines the divergence angle β and equations (7), (8) and (3) determine the annular beam radii in dependence on γ, the axicon separation $D_1$, and input pump beam waist $w_0$.

In all of the above embodiments, the axial separation of the axicons, $D_1$, is selected by means of the one or more movable mounts on which they are mounted in order to optimize certain parameters of the illumination source, as explained in more detail below. In addition, the input waist size, $w_0$, of the beam of pump radiation may be adjusted (e.g. using the variable beam expander/contractor) in order to further optimize said parameters. For the embodiments also including an input aperture as part of the transformation optics, the aperture size of the input aperture may be adjusted to further optimize said parameters.

Figure 11:
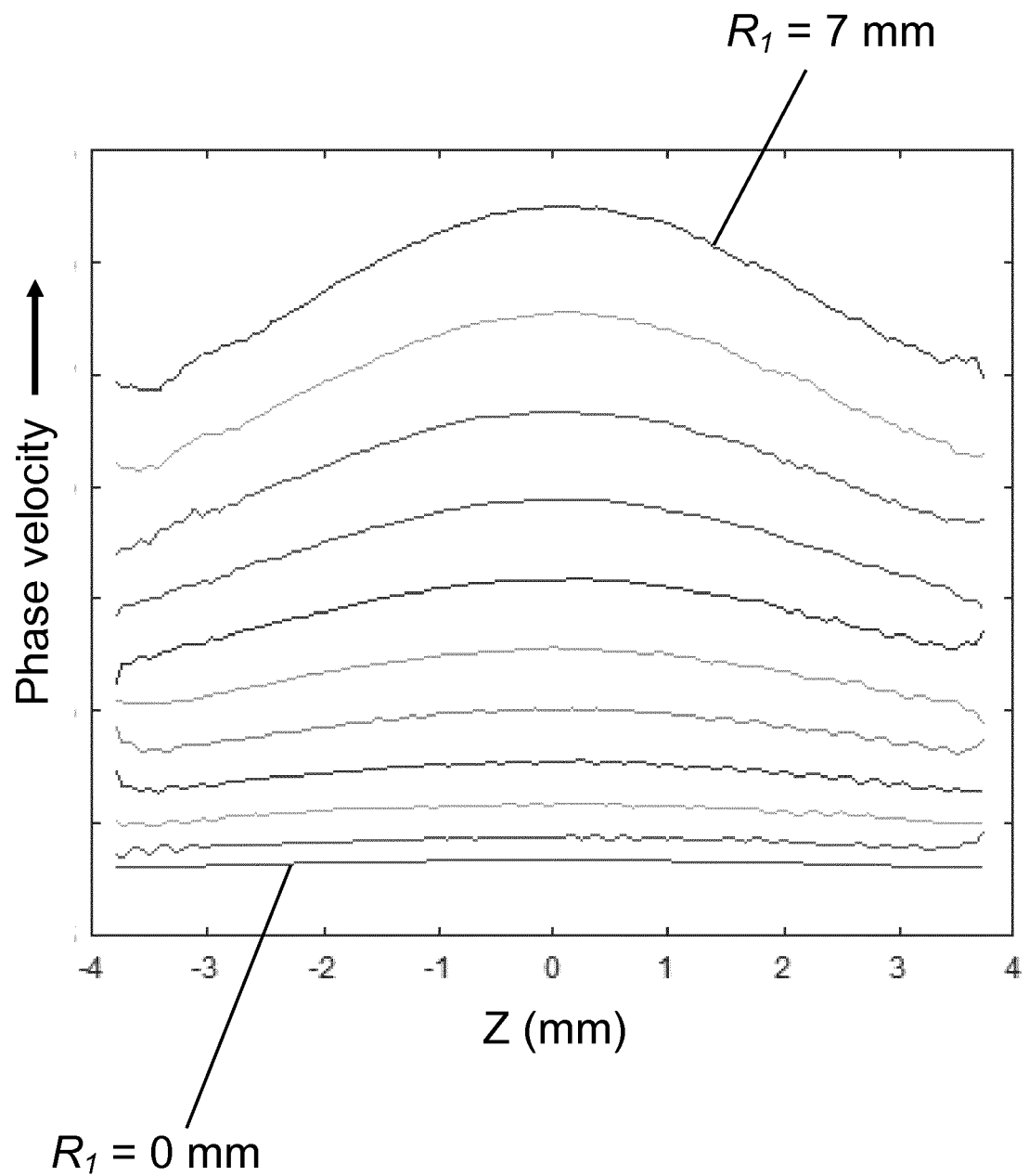
FIG. 11 shows the results of numerical modeling of the phase velocity through the focus of various annular beams of increasing inner radius.

A first parameter of the illumination source to be optimized is the conversion efficiency of the high harmonic generation process. Optimum soft X-ray and/or EUV generation is achieved in HHG by having the peak intensity region of the pump radiation inside or near the HHG medium, and by matching the phase of the pump radiation to that of the generated soft X-ray and/or EUV radiation as best as possible. The HHG medium is located substantially in the focal plane of the lens. The transformation optics comprise a negative and positive axicon pair (each having the same apex angle τ) to produce a collimated annular beam. As such the peak intensity of the pump radiation will be within the HHG medium. Furthermore, embodiments of the invention also enable the phase velocity of the pump radiation at the focus within the HHG medium to be tuned— thereby enabling the phase matching and hence conversion efficiency to be improved. To understand this effect, the Gouy phase through the focus of the transformed beam of pump radiation having an annular transverse spatial profile is approximately given by the following expression:

$$\varphi_{Gouy} = z\left(k - \left(k * \cos\left(\arctan\left(\frac{R_{av}}{f}\right)\right)\right)\right) + \arctan\left(\frac{zR_{av}k\Delta R}{\pi 2.8 f^2}\right) \quad (6)$$

where $R_{av}=(R_1+R_2)/2$, $\Delta R=R_2-R_1$, f is the focal length of the focusing element, k is the wave vector and z is the axial position relative to the focus at z=0. Since $R_1$ and $R_2$ are independently selectable by adjusting the axicon separation, $D_1$, and the input beam waist $w_0$, or the aperture size of the input aperture in those embodiments using an input aperture, the Gouy phase of the transformed beam through the focus in the HHG medium may be controllably influenced— thereby controlling the phase matching between the transformed beam and the generated high harmonic radiation. FIG. 11 shows the results of numerical modeling of the phase velocity through the focus of various annular beams of increasing inner radius $R_1$ and having a focus at z=0. The bottom line in the plot of FIG. 11 corresponds to a Gaussian beam (i.e. $R_1$=0 mm) with the subsequent lines corresponding to increasing $R_1$ radius up to a maximum value of $R_1$=7 mm for the top line, i.e. the annular beam with the greatest phase velocity. FIG. 11 therefore clearly demonstrates that the phase velocity of the transformed pump beam around the focus increases as $R_1$ increases. It is therefore possible to attain a target phase velocity by choosing appropriate values for $R_1$ and $R_2$ within the constraints imposed by other considerations, such as for example the suppression of the residual transformed beam, which is discussed below.

Figure 12:
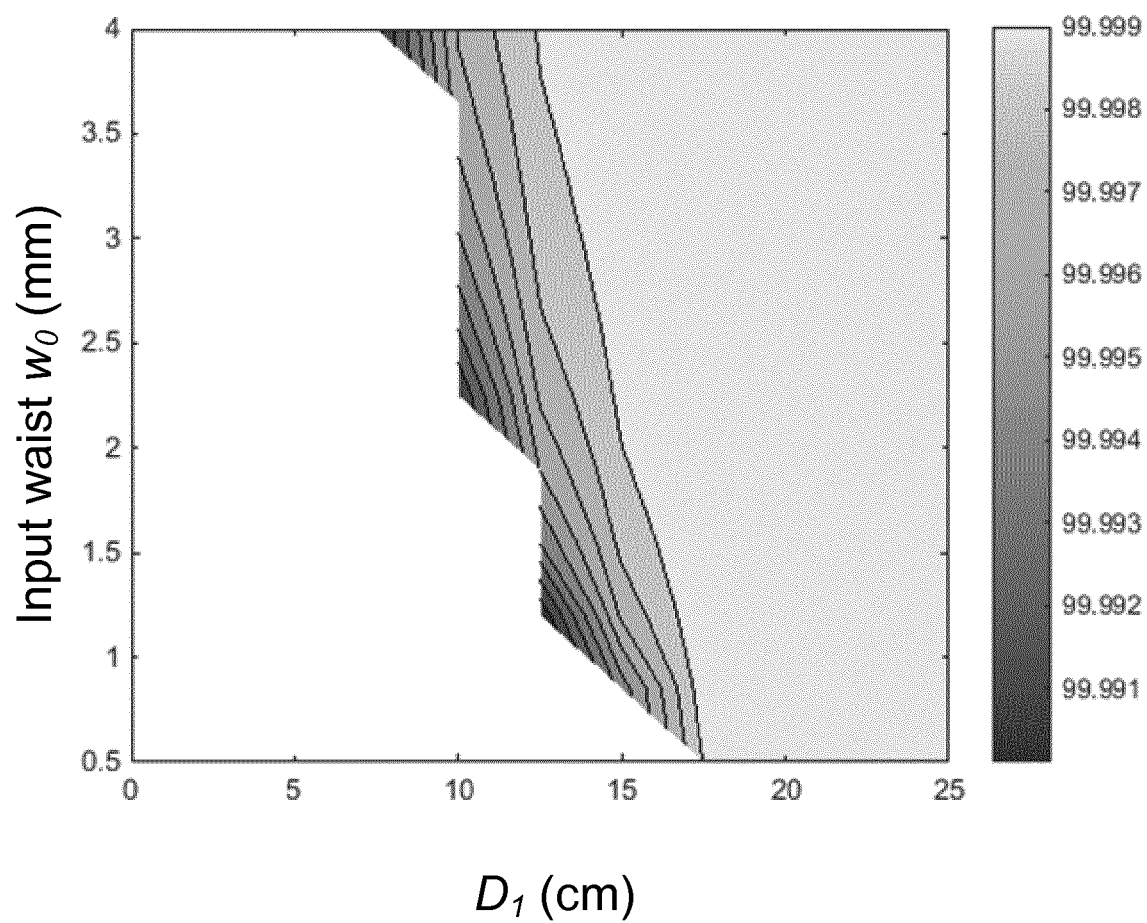
FIG. 12 shows results of numerical modeling of the suppression of the residual transformed beam as a function of the input pump beam waist $w_0$ and the axicon pair separation $D_1$.

A second parameter of the illumination source to be optimized in embodiments of the invention, either in addition to or separate from the first parameter above, is the suppression of the residual transformed beam remaining after the high harmonic generation process. Away from the focal plane at z=0, the residual transformed pump beam diverges into a hollow annular beam again, as described above with reference to FIGS. 5, 7 and 8. The blocking element in the form of an output aperture positioned in the far-field is matched to the width of the annulus of the transformed beam to enable removal of the residual transformed beam. This relies upon an emission cone of the generated HHG radiation that is smaller in transverse extent than that of the transformed beam divergence such that the output aperture will solely interact with the residual transformed beam and not the generated HHG radiation. Simulation results indicate that a suppression of the residual transformed beam of better than $10^{-5}$ is achievable if the divergence of the generated HHG radiation is less than 2.5 mrad. This suppression value is for an ideal situation with no scatter effects due to imperfect optical components. In one example, the output aperture may have a diameter of 2.5 mm and be placed a distance 500 mm from the focal plane. FIG. 12 shows the suppression of the residual transformed beam for this use case as a function of the input pump beam waist $w_0$ and the axicon pair separation $D_1$. The expected operating range for optimum soft x-ray and/or EUV emission is an axicon separation in the range 10 cm<$D_1$<25 cm and $R_2$ radius in the range 1.5 mm<$R_2$<3 mm.

In all of the above-described embodiments, the second axicon element and the focusing element could be combined into a single optical element. Further, a positive axicon may be used in place of any negative axicon in each of the above embodiments. This is because whilst a positive axicon initially causes incident radiation to be deflected towards the optical axis, after a sufficient propagation distance the radiation will pass through a 'focus' and begin to diverge away from the optical axis the other side of the focus.

The term "positive" as used with reference to an axicon element (either refractive, reflective or diffractive) should be understood to mean an axicon element which causes incident radiation to be deflected towards the optical axis. The term "negative" as used with reference to an axicon element (either refractive, reflective or diffractive) should be understood to mean an axicon element which causes incident radiation to be deflected away from the optical axis. The angle γ is used herein to denote the deflection angle at which incident radiation is deflected either towards or away from the optical axis by the positive/negative axicon having apex angle τ. Expressions linking the physical apex angle of the axicon, τ, with the deflection angle γ are given in equations (1) and (5) for the cases of refractive and reflective axicons respectively.

In a further embodiment of the invention, instead of using an axicon pair as used in all of the above-described embodiments, alternatively a variable beam expander/contractor can be used in combination with a circular beam block which is configured to block the central region of the expanded/contracted beam of pump radiation. In this manner an annular beam is generated which can be used to excite the HHG medium to generate soft x-ray and/or EUV radiation. The generated annular beam parameters can be adjusted to optimize the conversion efficiency and/or suppression of the residual pump beam. However, compared to the above embodiments, in which a negligible amount of the original pump beam energy is lost, a significant fraction of the original pump beam energy is lost due to absorption by the circular beam block.

In all of the above-described embodiments, the reflective or refractive axicon element may be replaced with diffractive optical elements (DOE). The DOE may replicate the refractive or reflective axicons and add further ability to modify the focal plane intensity and phase, for example, adding the function of the phase step like the TOP mirror does. When light incidents on the DOE, the structures on DOE diffract the incident light into a pre-determined intensity and phase distribution. DOE elements may be classified into two types, phase and amplitude or both. Optionally, an axicon DOE may be an annular grating of even radial period.

The first negative diffractive axicon element diffract the beam away from the optical axis forming a diverging annular beam. The second positive diffractive axicon corrects the diverging annulus forming a collimated annular beam. The DOE axicon is defined not by an apex angle but a divergence angle β. The divergence angle β is equivalent to twice as the deflection angle (2*Υ). The divergence angle is given by the standard grating equation, where λ is the wavelength and Λ is the diffraction period:

$$\beta = 2\sin^{-1}\left(\frac{\lambda}{\Lambda}\right). \quad (7)$$

The annulus radius $R_1$ as can be seen in FIG. 6, at a given distance from the element $D_1$ is given by:

$$R_1 = D_1 \cdot \tan\left(\frac{\beta}{2}\right). \quad (8)$$

In a further embodiment of the invention, two DOE elements of opposite divergence angle β are placed in series, a collimated annular beam is formed.

A further use of using DOE is the ability to customize the grating to introduce extra phase modulations in order to generate a custom focal plane intensity and phase profile.

In a further embodiment of the invention, more than one DOEs are combined in parallel or in series way in a single illumination source apparatus.

Spatial light modulators (SLM) can be used to generate fully custom programmable DOE which can be used to generated diffraction gratings. An SLM allows for real time modifications of the beam, which can be either used in conjunction with a fixed form DOE or as a design input for a fixed form DOE.

Figure 13:
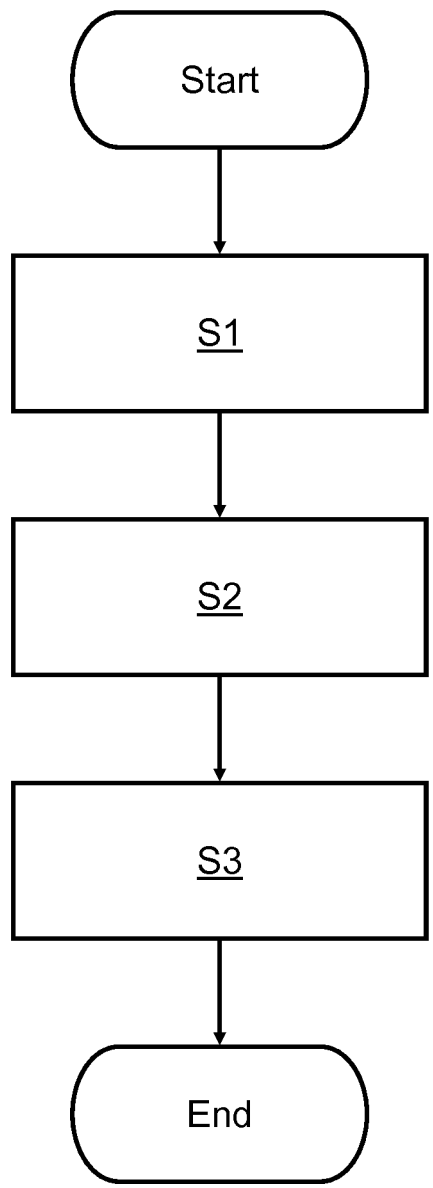
FIG. 13 is a flowchart of a method according to an embodiment of the invention.

FIG. 13 illustrates a method of operating an illumination source apparatus, suitable for use in a metrology apparatus for the characterization of a structure on a substrate, according to an embodiment of the invention. The method comprises:
  providing a high harmonic generation, HHG, medium (S1);
  operating a pump radiation source to emit a beam of pump radiation (S2); and
  transforming, by adjustable transformation optics, the transverse spatial profile of the beam of pump radiation to produce a transformed beam such that relative to the centre axis of the transformed beam, a central region of the transformed beam has substantially zero intensity and an outer region which is radially outwards from the centre axis of the transformed beam has a non-zero intensity, wherein the transformed beam excites the HHG medium so as to generate high harmonic radiation, (S3), wherein the location of said outer region is dependent on an adjustment setting of the adjustable transformation optics.

Further embodiments are disclosed in the subsequent numbered clauses:
1. An illumination source apparatus, suitable for use in a metrology apparatus for the characterization of a structure on a substrate, the illumination source apparatus comprising:
    a high harmonic generation, HHG, medium;
    a pump radiation source operable to emit a beam of pump radiation; and
    adjustable transformation optics configured to adjustably transform the transverse spatial profile of the beam of pump radiation to produce a transformed beam such that relative to the centre axis of the transformed beam, a central region of the transformed beam has substantially zero intensity and an outer region which is radially outwards from the centre axis of the transformed beam has a non-zero intensity, wherein the transformed beam is arranged to excite the HHG medium so as to generate high harmonic radiation,
    wherein the location of said outer region is dependent on an adjustment setting of the adjustable transformation optics.
2. The illumination source apparatus according to clause 1, wherein the pump radiation source is operable to emit a beam of pump radiation with a Gaussian transverse spatial profile, and wherein the adjustable transformation optics are configured to produce a transformed beam with a non-Gaussian transverse spatial profile.
3. The illumination source apparatus according to clause 1, wherein the pump radiation source is operable to emit a beam of pump radiation with a Gaussian transverse spatial profile, and wherein the adjustable transformation optics are configured to produce a transformed beam having an annular transverse spatial profile.

4. The illumination source apparatus according to any preceding clause, further comprising a focusing element positioned between the adjustable transformation optics and the HHG medium, the focusing element configured to focus the transformed beam into the HHG medium.

5. The illumination source apparatus according to clause 4, wherein the focusing element is a lens.

6. The illumination source apparatus according to clause 4 or 5, wherein the focal plane of the focusing element is positioned substantially in the HHG medium.

7. The illumination source apparatus according to any one of clauses 4 to 6, wherein the adjustable transformation optics comprise at least one conical optical element or diffractive optical element.

8. The illumination source apparatus according to clause 7, wherein the at least one diffractive optical element or conical optical element is an axicon element.

9. The illumination source apparatus according to any preceding claim, wherein the adjustable transformation optics comprise a pair of axicon elements consisting of a first axicon element and a second axicon element, wherein the first axicon element precedes the second axicon element relative to the propagation direction of the beam of pump radiation and wherein an axial separation between the first axicon element and the second axicon element controls said adjustment setting of the adjustable transformation optics.

10. The illumination source apparatus according to clause 9, wherein the pair of axicon elements consists of one negative axicon element and one positive axicon element.

11. The illumination source apparatus according to clause 9 or 10, wherein at least one of the axicon elements is a reflective axicon element.

12. The illumination source apparatus according to clause 10 or 11, wherein the first axicon element is a negative reflective axicon which is arranged on the centre axis of the beam of pump radiation and which is configured to reflect the beam of pump radiation towards the second axicon element which is an annular positive reflective axicon configured to collimate the beam to thereby produce said transformed beam.

13. The illumination source apparatus according to clause 9 or 10, wherein at least one of the axicon elements is a refractive axicon element.

14. The illumination source apparatus according to clause 13, wherein the first axicon element is a negative refractive axicon which is arranged on the centre axis of the beam of pump radiation and configured to diverge the beam of pump radiation towards the second axicon element which is a positive refractive axicon arranged on said centre axis and configured to collimate the beam to thereby produce said transformed beam.

15. The illumination source apparatus according to clause 9 or 10, wherein at least one of the axicon elements is a diffractive element.

16. The illumination source apparatus according to clause 15, wherein the first axicon element is a negative diffractive axicon which is arranged on the centre axis of the beam of pump radiation and configured to diverge the beam of pump radiation towards the second axicon element which is a positive diffractive axicon arranged on said centre axis and configured to collimate the beam to thereby produce said transformed beam.

17. The illumination source apparatus according to any one of clauses 9 to 16, wherein each axicon of the pair of axicon elements has substantially the same apex angle, $\tau$, or the same divergence angle, $\beta$, and the axicon elements are mounted on one or more movable mounts such that said axial separation, $D_1$, between the axicon elements is adjustable in use to control said adjustment setting.

18. The illumination source apparatus according to clause 17, further comprising a blocking element positioned after the HHG medium, the blocking element configured to suppress the residual transformed beam remaining after high harmonic generation, whilst substantially transmitting the generated high harmonic radiation.

19. The illumination source apparatus according to clause 18, wherein the blocking element is an output aperture aligned with the centre axis of the generated high harmonic radiation.

20. The illumination source apparatus according to clause 18 or 19, wherein the focusing element is configured to image the first axicon element onto the blocking element.

21. The illumination source apparatus according to any one of clauses 18 to 20, wherein in use the axial separation of the axicons, $D_1$, is selected by means of the one or more movable mounts in order to optimize, for a given axicon apex angle $\tau$ or a given divergence angle $\beta$:
(A) the conversion efficiency of the high harmonic generation process; and/or
(B) the suppression of the residual transformed beam.

22. The illumination source apparatus according to clause 21, wherein the adjustable transformation optics further comprise a variable beam expander/contractor configured to adjust the input waist size, $w_0$, of the beam of pump radiation, and wherein in use $w_0$ is selected in order to further optimize (A) and (B).

23. The illumination source apparatus according to clause 22, wherein the transformed beam is a collimated annular beam having an annulus radius $R_1$ and a ring width $R_2$, wherein:

$$R_1 = L \tan(\gamma); \text{ and}$$

$$R_2 = R_1 + w_0,$$

where $\gamma$ is the deflection angle (as defined herein) of the axicon.

24. The illumination source apparatus according to clause 23, wherein the adjustable transformation optics further comprise an input aperture located on the centre axis of the beam of pump radiation, wherein the input aperture is positioned after the axicon elements and prior to the HHG medium with respect to the direction of propagation of the beam of pump radiation, and the focusing element is configured to image the input aperture onto the blocking element, and wherein in use the aperture size of the input aperture is selected in order to further optimize (A) and (B).

25. The illumination source apparatus according to clause 24, wherein the input aperture is configured to adjust the ring width $R_2$.

26. A method of operating an illumination source apparatus, suitable for use in a metrology apparatus for the characterization of a structure on a substrate, the method comprising:
providing a high harmonic generation, HHG, medium;
operating a pump radiation source to emit a beam of pump radiation; and
transforming, by adjustable transformation optics, the transverse spatial profile of the beam of pump radiation to produce a transformed beam such that relative to the centre axis of the transformed beam, a central region of the transformed beam has substantially zero intensity and an outer region which is radially outwards from the centre axis of the transformed beam has a non-zero intensity, wherein the transformed beam excites the HHG medium so as to generate high harmonic radiation, wherein the location of said outer region is dependent on an adjustment setting of the adjustable transformation optics.

27. The method according to clause 26, wherein the pump radiation source emits a beam of pump radiation with a Gaussian transverse spatial profile, and wherein the adjustable transformation optics produce a transformed beam with a non-Gaussian transverse spatial profile.

28. The method according to clause 26, wherein the pump radiation source emits a beam of pump radiation with a Gaussian transverse spatial profile, and wherein the adjustable transformation optics produce a transformed beam having an annular transverse spatial profile.

29. The method according to any one of clauses 26 to 28, further comprising focusing the transformed beam into the HHG medium using a focusing element positioned between the adjustable transformation optics and the HHG medium.

30. The method according to any one of clauses 26 to 29, wherein the adjustable transformation optics comprise a pair of axicon elements consisting of a first axicon element and a second axicon element, wherein the first axicon element precedes the second axicon element relative to the propagation direction of the beam of pump radiation and wherein the axial separation between the first axicon element and the second axicon element is adjusted to control said adjustment setting of the adjustable transformation optics.

31. The method according to clause 30, wherein each axicon of the pair of axicon elements has substantially the same apex angle, τ, or the same divergence angle, β, and the axicon elements are mounted on one or more movable mounts, the method further comprising adjusting the axial separation, $D_1$, between the axicon elements to control said adjustment setting.

32. The method according to clause 31, further comprising suppressing, using a blocking element positioned after the HHG medium, the residual transformed beam remaining after high harmonic generation, whilst substantially transmitting the generated high harmonic radiation.

33. The method according to clause 32, further comprising imaging the first axicon element onto the blocking element.

34. The method according to any one of clauses 31 to 33, further comprising selecting the axial separation, $D_1$, between the axicon elements in order to optimize:
(A) the conversion efficiency of the high harmonic generation process; and/or
(B) the suppression of the residual transformed beam.

35. The method according to clause 34, further comprising adjusting the input waist size, $w_0$, of the beam of pump radiation using a variable beam expander/contractor, in order to further optimize (A) and (B).

36. The method according to clause 35, wherein the adjustable transformation optics further comprise an input iris located on the centre axis of the beam of pump radiation, wherein the input iris is positioned after the axicon elements and prior to the HHG medium with respect to the direction of propagation of the beam of pump radiation, and the focusing element is configured to image the input iris onto the blocking element, and wherein the aperture size of the input iris is selected in order to further optimize (A) and (B).

37. A computer program comprising instructions which, when executed on at least one processor, cause the at least one processor to control an apparatus to carry out a method according to any one of clauses 26 to 36.

38. A carrier containing the computer program according to clause 37, wherein the carrier is one of an electronic signal, optical signal, radio signal, or non-transitory computer readable storage medium.

39. A lithographic apparatus comprising the illumination source apparatus according to any one of clauses 1 to 25.

40. A lithographic cell comprising the lithographic apparatus according to clause 39.

41. A metrology apparatus comprising an illumination source apparatus according to any one of the clause 1 to 25.

42. A lithographic cell comprising a metrology apparatus according to clause 41.

In the context of the above document the term HHG or HHG source is introduced. HHG refers to High Harmonic Generation or sometimes referred to as high order harmonic generation. HHG is a non-linear process in which a target, for example a gas, a plasma or a solid sample, is illuminated by an intensive laser pulse. Subsequently, the target may emit radiation with a frequency that is a multiple of the frequency of the radiation of the laser pulse. Such frequency, that is a multiple, is called a harmonic of the radiation of the laser pulse. One may define that the generated HHG radiation is a harmonic above the fifth harmonic and these harmonics are termed high harmonics. The physical process that forms a basis of the HHG process is different from the physical process that relates to generating radiation of the lower harmonics, typically the 2nd to 5th harmonic. The generation of radiation of the lower harmonic relates to perturbation theory. The trajectory of the (bound) electron of an atom in the target is substantially determined by the Coulomb potential of the host ion. In HHG, the trajectory of the electron that contributes to the HHG process is substantially determined by the electric field of the incoming laser light. In the so-called "three step model" describing HHG, electrons tunnel through the Coulomb barrier which is at that moment substantially suppressed by the laser field (step 1), follow a trajectory determined by the laser field (step 2) and recombine with a certain probability while releasing their kinetic energy plus the ionization energy in the form of radiation (step 3). Another way of phrasing a difference between HHG and the generation of radiation of the lower harmonic is to define that all radiation with photon energy above the ionization energy of the target atoms as "High Harmonic" radiation, e.g. HHG generated radiation, and all radiation with photon energy below the ionization energy as non-HHG generated radiation. If Neon is used as a gas target, all radiation with a wavelength shorter than 62 nm (having a photon energy higher than 20.18 eV) is generated by means of the HHG process. For Argon as a gas target, all radiation having a photon energy higher than about 15.8 eV is generated by means of the HHG process.

Although specific reference is made in this text to "metrology apparatus", this term may also refer to an inspection apparatus or an inspection system, e.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although it has been mentioned that an axicon element is a reflective axicon element or a refractive axicon element, it should be understood that the reflective axicon element or refractive axicon element may be replaced with a diffractive axicon element.

The invention claimed is:

1. An illumination source apparatus, suitable for use in a metrology apparatus for the characterization of a structure on a substrate, the illumination source apparatus comprising:
    a pump radiation source configured to emit a beam of pump radiation; and
    transformation optics configured to transform a transverse spatial profile of the beam of pump radiation to produce a transformed beam such that, relative to a center axis of the transformed beam, a central region of the transformed beam has substantially zero intensity and an outer region that is radially outwards from the center axis of the transformed beam has a non-zero intensity, wherein the transformed beam is arranged to excite a medium so as to generate a generated radiation, and wherein the transformation optics comprise a negative element.

2. The illumination source apparatus of claim 1, wherein the transformation optics comprise a positive element.

3. The illumination source apparatus of claim 2, wherein the positive element and the negative element have substantially the same apex angle, τ, or the same divergence angle, β.

4. The illumination source apparatus of claim 2, wherein the positive element precedes the negative element or the negative element precedes the positive element relative to propagation direction of the beam of pump radiation.

5. The illumination source apparatus of claim 1, wherein the transformation optics comprise one of a reflective element, a refractive element and a diffractive element.

6. The illumination source apparatus claim 1, further comprising a focusing element positioned between the transformation optics and the medium, the focusing element configured to focus the transformed beam into the medium, and wherein the focusing element is a lens.

7. The illumination source apparatus of claim 6, wherein the focal plane of the focusing element is positioned substantially in the medium.

8. The illumination source apparatus of claim 1, further comprising a blocking element positioned after the medium, the blocking element configured to suppress a residual of the transformed beam remaining after generation of the generated radiation, while substantially transmitting the generated radiation.

9. The illumination source apparatus of claim 8, wherein the blocking element is an output aperture aligned with a center axis of the generated radiation.

10. The illumination source apparatus of claim 1, wherein the transformed beam is a collimated annular beam having an annulus radius $R_1$ and a ring width $R_2$, wherein:

$R_1 = L \tan(\gamma)$; and $R_2 = R_1 + w_0$, where $\gamma$ is deflection angle and $w_0$ is waist size of the beam of pump radiation.

11. The illumination source apparatus of claim 1, wherein the transformation optics further comprise an input aperture located on the center axis of the beam of pump radiation.

12. The illumination source apparatus of claim 11, wherein the input aperture is positioned with respect to the direction of propagation of the beam of pump radiation.

13. A lithographic cell comprising the illumination source apparatus of claim 1.

14. A metrology apparatus comprising an illumination source apparatus of claim 1.

15. The illumination source apparatus of claim 1, wherein the transformative optics comprise a pair of refractive axicon elements placed in series and separated by a predetermined axial separation distance.

16. A method of operating an illumination source apparatus, suitable for use in a metrology apparatus for the characterization of a structure on a substrate, the method comprising:
    operating a pump radiation source to emit a beam of pump radiation; and
    transforming, by transformation optics, a transverse spatial profile of the beam of pump radiation to produce a transformed beam such that relative to a center axis of the transformed beam, a central region of the transformed beam has substantially zero intensity and an outer region that is radially outwards from the center axis of the transformed beam has a non-zero intensity, wherein the transformed beam excites a medium so as to generate a generated radiation, and wherein the transformation optics comprise a negative element.

* * * * *